(12) United States Patent
Ku et al.

(10) Patent No.: US 12,471,318 B2
(45) Date of Patent: Nov. 11, 2025

(54) LOW DEFECT, HIGH MOBILITY THIN FILM TRANSISTORS WITH IN-SITU DOPED METAL OXIDE CHANNEL MATERIAL

(71) Applicant: Intel Corporation, Santa Clara, CA (US)

(72) Inventors: Chieh-Jen Ku, Hillsboro, OR (US); Andre Baran, Portland, OR (US); Bernhard Sell, Portland, OR (US); David Goldstein, Beaverton, OR (US); Timothy Jen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 955 days.

(21) Appl. No.: 17/308,856

(22) Filed: May 5, 2021

(65) Prior Publication Data

US 2022/0359759 A1    Nov. 10, 2022

(51) Int. Cl.
  *H10D 30/67* (2025.01)
  *H01L 21/02* (2006.01)
  (Continued)

(52) U.S. Cl.
  CPC ... *H10D 30/6755* (2025.01); *H01L 21/02565* (2013.01); *H01L 21/02614* (2013.01);
  (Continued)

(58) Field of Classification Search
  CPC ........... H01L 29/7869; H01L 21/02565; H01L 21/02614; H01L 27/1207; H01L 29/517;
  (Continued)

(56) References Cited

U.S. PATENT DOCUMENTS

| | | | |
|---|---|---|---|
| 2002/0043722 A1* | 4/2002 | Taguwa | H01L 21/28556 257/E21.585 |
| 2005/0199961 A1* | 9/2005 | Hoffman | H01L 29/7869 257/368 |

(Continued)

OTHER PUBLICATIONS

Partial European Search Report from European Patent Application No. 22164193.9 notified Sep. 1, 2022, 15 pgs.

(Continued)

*Primary Examiner* — William B Partridge
*Assistant Examiner* — David Paul Sedorook
(74) *Attorney, Agent, or Firm* — Essential Patents Group, LLP

(57) ABSTRACT

Transistors with metal oxide channel material that is in-situ doped for desired charge carrier concentrations. The metal oxide channel material may be deposited by atomic layering of multiple constituent metals with an oxidation of each layer. Such an ALD process may be performed by cyclically depositing a precursor of one of the metals upon a substrate during a deposition phase, and oxidizing the absorbed precursor during an oxidation phase. For a quinary metal oxide, each of three metal precursors may be introduced and oxidized during the ALD process, and charge carrier concentrations may be modulated by further introducing a fourth metal precursor during the ALD process in a manner that disperses this dopant metal within the film at a significantly lower chemical concentration than the other metals.

13 Claims, 16 Drawing Sheets

(51) Int. Cl.
*H10D 64/68* (2025.01)
*H10D 87/00* (2025.01)
*H10D 99/00* (2025.01)

(52) U.S. Cl.
CPC ....... *H10D 30/6757* (2025.01); *H10D 64/691* (2025.01); *H10D 87/00* (2025.01); *H10D 99/00* (2025.01)

(58) Field of Classification Search
CPC ........ H01L 29/66969; H01L 29/78696; H10D 30/6757; H10D 64/491; H10D 87/00; H10D 99/00; H10D 86/423; H10D 86/60
See application file for complete search history.

(56) References Cited

U.S. PATENT DOCUMENTS

2011/0042668 A1* 2/2011 Hama ............... H01L 29/78693
257/E29.296
2013/0248858 A1* 9/2013 Morita ............. H01L 21/02631
257/43
2020/0411078 A1* 12/2020 Sharma ................ H10B 12/315
2020/0411692 A1* 12/2020 Dewey ................ H10D 62/862

OTHER PUBLICATIONS

Fortunato, E., et al., "Oxide Semiconductor Thin-Film Transistors: A Review of Recent Advances", Advanced Materials (2012), 24, pp. 2945-2986.

Hsu, Hsiao-Hsuan, et al., "Amorphous Titanium Oxide Semiconductors on Quasi-Crystal-Like InGaZnO Channels for Thin Film Transistor Applications", Journal of Display Technology, vol. 11, No. 6, Jun. 2015, 6 pgs.

Lee, Ching-Ting, et al., "High stability mechanisms of quinary indium gallium zinc aluminum oxide multicomponent oxide films and thin film transistors", Journal of Applied Physics 117, 045309 (2015), 7 pgs.

Extended European Search Report from European Patent Application No. 22164193.9 notified Nov. 23, 2022, 13 pgs.

* cited by examiner

LOW DEFECT, HIGH MOBILITY THIN FILM TRANSISTORS WITH IN-SITU DOPED METAL OXIDE CHANNEL MATERIAL

BACKGROUND

A thin-film transistor (TFT) is a class of field-effect transistors (FETs) in which the channel semiconductor material is a deposited thin film rather than a surface layer of a substantially monocrystalline substrate material. Group IV materials (e.g., Si, Ge) may be employed in TFTs, but metal oxide semiconductors, such as those including In and Ga, are also promising channel materials for TFTs. Metal oxide semiconductors have the potential to be deposited at low temperatures (e.g., below 450° C.). If a thin film semiconductor material can be deposited at sufficiently low temperatures, one or more transistor device levels may be integrated monolithically with one or more other device levels that may include devices, such as CMOS FETs that have been fabricated within an underlying bulk semiconductor layer, other TFTs, or memory devices. As one specific example, embedded dynamic random access memory (eDRAM) may be monolithically integrated with CMOS circuitry with TFTs controlling access and/or addressing of the memory array.

However, low-temperature metal oxide deposition processes generally rely upon physical vapor deposition (PVD) techniques, such as RF magnetron sputtering Films deposited by sputter deposition techniques suffer high levels of intrinsic defects, lack conformality, and have compositions that rely primarily on the composition of one or more sputtering targets. Metal oxide semiconductor films have also displayed low thermal stability, with their electrical properties degrading as subsequent thermal processes are performed. Efforts to mitigate oxygen vacancies and metal interstitials within a sputtered film have included hydrogen treatments as well as other post-deposition (ex-situ) doping processes. For example, after a metal oxide material is sputter deposited, one or more species may be introduced into the thin film (e.g., through ex-situ implantation) in an effort to tune (e.g., suppress) free carriers within the metal oxide material.

However, post-deposition doping techniques can often lead to damage of the thin film material and/or introduce a number of defects, particularly at the top surface of the thin film, which depending on the architecture of the transistor, may interface with a gate dielectric material. Defects at the interface with gate dielectric material are known to be particularly detrimental to transistor performance Such post-deposition doping processes also necessitate additional processing steps (e.g., ion implantation and one or more thermal anneals).

Techniques for forming a thin film of metal oxide semiconductor material that can overcome one or more of the above issues, and the TFT resulting from such techniques, would therefore be commercially advantageous.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
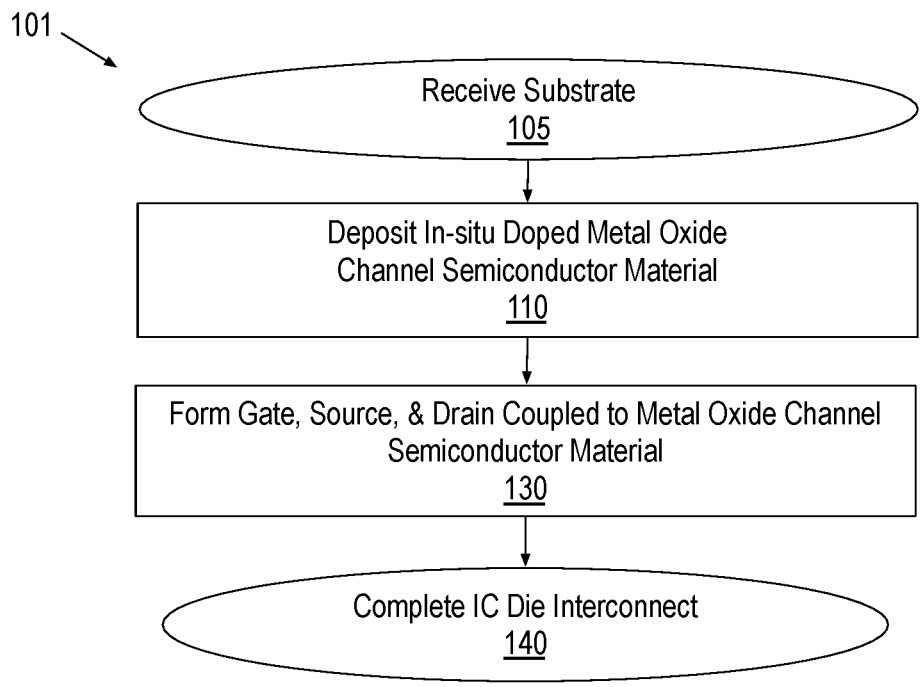
FIG. 1A is a flow diagram illustrating methods of fabricating transistor including an in-situ doped metal oxide channel material, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. The term "substantially" means there is no more than incidental variation from a target value. For example, a composition that is substantially a first constituent means the composition only includes trace levels of any constituent other than the first constituent.

Described herein are transistor structures that include a metal oxide material operable as a channel of a transistor. The metal oxide channel material is advantageously formed with an atomic layer deposition (ALD) process. Metal oxide channel material may be in-situ doped during the ALD process to achieve desired charge carrier concentrations. According to exemplary ALD processes, a metal oxide channel material comprising more than one metal may be deposited by an atomic layering of multiple constituent metals (e.g., binary, ternary, quaternary, etc.) with an oxidation of each layer. Such an ALD process may be performed by cyclically adsorbing a precursor of one of the metals to a surface of a substrate during a deposition phase, and oxidizing the absorbed precursor during an oxidation phase.

In some exemplary embodiments, a metal oxide is formed with (e.g., three) different metal precursors introduced and oxidized during the ALD process at one or more cycle frequencies within an ALD super cycle to achieve a desired atomic concentration ratio of the (e.g., three) metals throughout a metal oxide material of a desired thickness. Charge carrier concentrations within a metal oxide material may be modulated by further introducing another (e.g., fourth) metal precursor during the ALD process in a manner that disperses this dopant metal within the (e.g., quinary) metal oxide film at a significantly lower chemical concentration than the other constituent metals. As further described below, one or more of the cycles performed to deposit the majority metal constituents may be modified to further include the fourth metal precursor. Alternatively, a separate ALD cycle for depositing a metal dopant may be interleaved into an ALD hyper cycle that further includes an ALD super cycle iterated to deposit the various primary metal constituents. Similar techniques may be employed to form a metal oxide of two metals, or more than four metals.

Transistors incorporating a metal oxide semiconductor material deposited in accordance with the ALD techniques described herein may benefit from high mobility and low defectivity. Although not bound by theory, the inventors understand the introduction of a metal dopant in-situ with the deposition of the majority constituent metals introduces far fewer defects than ex-situ/post-deposition processing of a metal oxide deposited by less controlled techniques, such as sputter depositions. With the flexibility of the ALD techniques exemplified herein, the inventors have found transistors including an exemplary quinary metal oxide channel material to have much improved electrical performance relative to reference structures incorporating an ex-situ doped metal oxide channel material.

In some advantageous embodiments, a thin film field effect transistor (TFT) includes a channel material of an oxide comprising each of In, Ga, Zn and Al (IGZAO). The inventors have further discovered certain atomic concentration ratios of In:Ga:Zn:Al to improve one or more of sub-threshold slope and $I_{on}/I_{off}$ drive current ratio of a TFT. Accordingly, the ALD techniques exemplified herein can also be leveraged to tune the threshold voltage (Vt) of a TFT. The flexibility of the ALD techniques exemplified herein also facilitate non-planar TFT architectures, at least in part, because of the greater conformality of the ALD process relative to a PVD/sputter process. Therefore, a metal oxide material may be deposited over a topographic feature with portions of the resulting metal oxide film adjacent to feature sidewalls having substantially the same thickness as portion of the metal oxide film that is over a top of the feature. Hence, limitations associated with the non-conformality of PVD films can be avoided, and further dimensional scaling enabled.

FIG. 1A is a flow diagram illustrating methods 101 for fabricating transistor including an in-situ doped metal oxide channel material, in accordance with some embodiments. Methods 101 begin at block 105 where a substrate is received. The substrate may advantageously include a monocrystalline semiconductor layer, such as a silicon layer, upon which front-end-of-line (FEOL) FETs have been fabricated, for example upstream of methods 101. The substrate received may include FEOL FETs of any architecture that are interconnected with one or more metallization levels into FEOL circuitry. In some examples, the FEOL FETs include both n-type and p-type FETs interconnected into a CMOS FEOL circuit. Although the substrate received at block 105 may include FEOL FETs, the substrate may instead lack any prefabricated transistors or other microelectronic devices.

Methods 101 continue at block 110 where an in-situ doped metal oxide channel semiconductor material is deposited upon a working surface of the substrate. The material deposited at block 110 may have any metal oxide composition that is suitable as channel region of an operative transistor, and is therefore referred to herein as "channel material." In some embodiments, the channel material comprises a thin film that may be semiconducting substantially as-deposited, and/or following some subsequent activation process, such as a thermal anneal.

In exemplary embodiments, the channel material is deposited with a conformal technique that may be further leveraged to introduce a metal constituent as a dopant during the deposition process. Because the dopant is introduced during deposition block 110, it is referred to herein as "in-situ" doping in contrast to an "ex-situ" doping process performed at some point downstream of block 110. In accordance with some embodiments, metal oxide channel material is deposited at block 110 with an atomic layer deposition (ALD) process. For some exemplary low temperature embodiments, the ALD deposition is performed at temperatures that do not to exceed 450° C., and advantageously between 200 and 300° C. Internal pressures of the ALD deposition process may be in the range of 1-3 Torr, for example As described further below, the ALD deposition process entails cyclically depositing a precursor of each of a plurality of metals during a deposition phase of separate ALD cycles, and oxidizing the deposited precursor of each of a plurality of metals during an oxidation phase of each of the cycles.

The ALD processes described herein are suitable for directly depositing a thin film of channel semiconductor material having material thicknesses in the range 2-20 nm, for example. At these thicknesses, an oxide semiconductor can have good transistor channel characteristics, for example offering high carrier mobility and a material band gap and resistivity that is tunable by a dopant that impacts the charge carrier (e.g. electron) concentrations. Oxide semiconductor materials primarily include one or more metals (M1, M1M2, M1M2M3, etc.) and oxygen (O). The metal(s) may be from the transition metals (e.g., IUPAC group 4-10) or post-transition metals (e.g., IUPAC groups 11-15), for example. The metal oxide compounds may be suboxides ($A_2O$), monoxides (AO), binary oxides ($AO_2$), ternary oxides ($ABO_3$), and mixtures thereof, for example. In some advantageous embodiments, the channel material deposited at block 110 includes 0 and at least one of Mg, Cu, Zn, Sn, Ti, In, Ga, or Al.

The metal oxide deposited at block 110 may include any atomic concentration ratio of metal constituents. For example, a binary metal alloy $M1_yM2_{1-y}$ may include any atomic percent of a first metal (M1) and a complementary atomic percent of a second metal (M2), or metalloid/nonmetal. A ternary alloy $M1_yM2_zM3_{1-y-z}$ may include any atomic percent of metal M1, any atomic percent of metal M2, and a complementary atomic percent of a third metal (M3), such that y and z are both greater than 0, but sum to less than 1. In some specific embodiments, the channel material deposited at block 110 comprises comprise a zinc oxide ($ZnO_x$), such as Zn(II) oxide, or ZnO, zinc peroxide ($ZnO_2$) or a mixture of ZnO and $ZnO_2$. In some further embodiments, the oxide semiconductor material deposited at block 110 comprises $ZnO_x$ and indium oxide $InO_x$ (e.g., $In_2O_3$). In some further embodiments, the oxide semiconductor material deposited at block 110 is IGZO, which comprises zinc oxide, indium oxide, and gallium oxide (e.g., $Ga_2O_3$). The metal atomic composition ratio, for example Ga to each of In and Z (Ga:In:Z), may vary. In exemplary embodiments these three metals are all majority constituents. In some examples, a Ga-rich IGZO is deposited at block 110. As further described below, the inventors have found an atomic composition ratio of Ga:In:Zn of 1.5-2.5: 1:1 to provide improved transistor performance.

One or more additional metals may be introduced as an in-situ dopant of IGZO. This dopant is also introduced at block 110, but at a significantly lower, minority constituent concentration than the majority constituents. In the examples further described below, an IGZO film deposited at block 110 is doped with Al (i.e., IGZAO). Although other dopant metals are possible, the inventors have found Al at relatively low atomic concentrations provides significant control over charge carrier concentrations. In the exemplary IGZ(A)O embodiments, the channel material is n-type with carrier concentrations being a strong function of Al concentration. As described further below, the concentration of Al dopant may vary, for example as a function of the concentrations of the majority constituents. Dopant levels in channel semiconductor material deposited at block 110 may also be selected based, in part, on a desired threshold voltage ($V_t$) associated with gating the channel region of a transistor, and/or a desired transistor drive current ($I_{on}$), for example. In some exemplary embodiments, Al is no more than 5 at. % of the metals present in the channel material.

The introduction of Al dopant may also improve the thermally stability of the metal oxide. For example, the inventors have found some oxide semiconductors, such as $ZnO_x$ and IGZO, decompose at elevated temperatures (e.g., above 250° C.-300° C.). As a result, semiconducting properties of such materials may be lost during subsequent IC fabrication processes. However, introduction of Al, which forms strong bonds with oxygen, may help the metal oxide material survive subsequent processing temperatures in excess of 400° C. (e.g., 500° C.-800° C.) and/or the subsequent introduction of materials that would otherwise tend to adversely modify the oxygen content within the metal oxide.

Although exemplary embodiments introduce one or more metals (e.g., Al) as in-situ dopants, other electrically active dopants may be introduced as an additional or alternative means of tuning the semiconducting properties of the channel material deposited at block 110. Exemplary alternative dopants that may introduce electron vacancies or oxygen vacancies, include N, H, F, Cl, Si, Ge. Whether metallic or non-metallic, most dopants can be readily detected along with the metal majority constituents by one or more chemical analysis techniques, such as X-ray photoelectron spectroscopy (XPS), energy dispersive spectroscopy (EDS), or electron energy loss spectroscopy (EELS).

Channel material deposited at block 110 may have any morphology or microstructure. In some embodiments, channel material deposited at block 110 is substantially amorphous (i.e., having no discernable long-rang order). However, depending on the substrate, the ALD process employed at block 110 may form polycrystalline (e.g., microcrystalline or nanocrystalline) metal oxide material.

Methods 101 continue at block 130 with the formation of transistor terminals, and methods 101 may then end at output 140 with completion of IC die interconnection, for example to couple terminals of multiple transistors into circuitry. Notably, block 130 may be performed before or after block 110. Hence, while in FIG. 1 illustrates the formation of a gate terminal, source terminal and drain terminal following deposition of the channel material, one or more transistor terminals may instead be formed prior to formation of the channel material. For example, in some embodiments a gate electrode may be formed over a channel material, and then source and drain terminals may be formed to the channel material. In another example, all terminals of a transistor structure may be formed prior to deposition of the channel material. As the ordering of the blocks 110, and 130 may be varied to arrived at particular transistor structures, a number of exemplary transistor structures including an in-situ doped metal oxide channel material that may be formed in accordance with various implementations of methods 101 are further described below.

For the ALD deposition of metal oxide channel material in methods 101, the cyclic deposition processes may be performed a time-divided and/or space-divided manner Time-divided embodiments may be performed with a workpiece contained within a single environment with conditions of the environment modified over time. Space-divided embodiments may be performed with a workpiece passing through multiple environments, each of environments maintaining distinct condition. Space and time divided embodiments combining these attributes are also possible, for example with a workpiece passing through a plurality of environments and various ones of the plural environments being further modified over time.

Figure 1B:
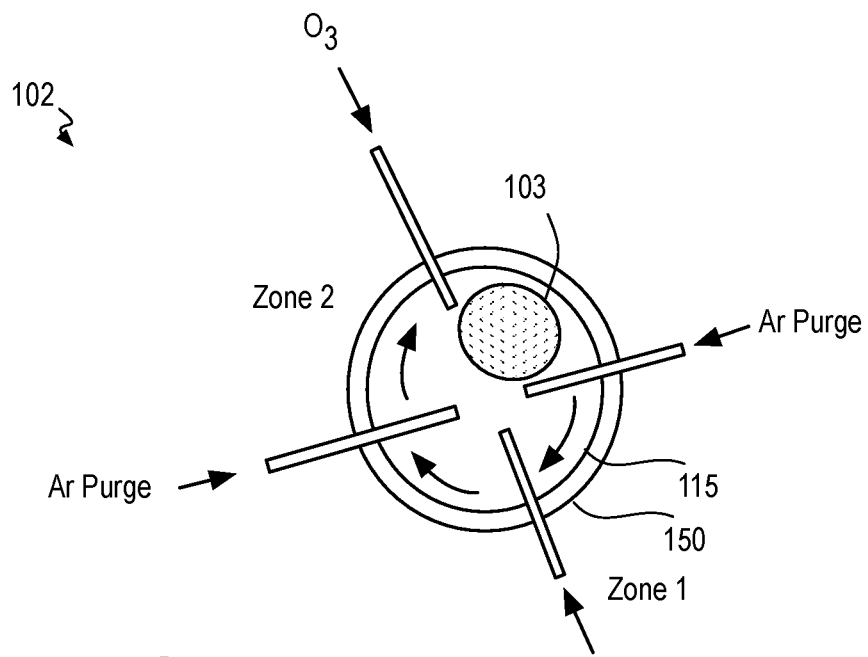
FIG. 1B a top-down plan view of a schematic of a spatial atomic layer deposition (SALD) chamber suitable for performing the methods illustrated in FIG. 1A, in accordance with some embodiments.

FIG. 1B a top-down plan view of a schematic of a spatial atomic layer deposition (SALD) chamber 102 that is suitable for performing the methods illustrated in FIG. 1A. SALD system 102 includes a chamber 150 within which a wafer 103 has been loaded upon at rotatable platen or chuck 115. At block 110 (FIG. 1A), and as further described below, a metal precursor is introduced into a first zone of chamber 150 (FIG. 1B) during a first phase of an ALD cycle. In exemplary embodiments, the metal precursor is an organometallic suitable for thermal or plasma enhanced adsorption to a surface of wafer 103. An oxygen precursor may be introduced into a second zone of chamber 150 during an oxidation phase of the ALD cycle. Any oxygen precursor known to be suitable for oxidizing the adsorbed metal precursor may be introduced into the second zone of chamber 150. For example, the oxygen precursor may be ozone, water, hydrogen peroxide, $CO_2$, $N_2O$, or $O_2$, which may be) plasma activated, or not.

As shown in FIG. 1B, the two zones within chamber 150 are spatially separated by one or more intervening zone(s) where one or more non-reactive purge gases (e.g., Ar) are introduced. As platen 115 is rotated (e.g., clockwise) during the deposition of the metal oxide, wafer 103 alternately passes through the first and second chamber zones with each revolution while the precursors are continuously flowed within their respective zones. One full revolution of platen 115 therefore corresponds to one ALD cycle. As described further below, any number of ALD cycles may be executed before the deposition of a particular metal precursor is terminated. Another metal precursor may then be introduced, for example in the first zone, during one or more additional ALD cycles with wafer 103 continuing to alternately pass through the first and second chamber zones during each additional cycle. Any number of a plurality of metal precursors may be similarly iteratively introduced to form any of a binary, ternary, quaternary, quinary etc. metal oxide before wafer 103 is unloaded from chamber 150.

In exemplary embodiments where IGZ(A)O is deposited, a precursor for each of In, Ga, and Zn may be introduced into one or more chamber zones. In some examples, the indium precursor is trimethylindium (TMI), triethylindium (TEI), or cyclopentadienyl indium (CpIn). As a further example, the gallium precursor can be one or more of timethylgallium (TMG), triethylgallium (TEG), or tris-dimethylamidogallium (TDMAGA). As a further example, the zinc precursor can be one or more of diethylzinc (DEZ) or dimethylzinc (DMZ). For embodiments where Al is introduced as a dopant, an additional precursor with Al is introduced into one or more chamber zones. As a few examples, the Al precursor can be one or more of trimethylaluminum (TMA), triethylaluminum (TEA), or aluminum trichloride.

Although not illustrated in FIG. 1B, the oxygen precursor may be energized into a plasma, for example with any suitable RF generator or magnetron. One or more other gases (e.g., an inert such as He, Ar, etc.) may also be energized along with the oxygen precursor(s). As further described below, each of the metal precursors that are to be incorporated into a metal oxide thin film may be flowed separately within a single ALD cycle, or two or more metal precursors may be flowed within a single ALD cycle. For example, multiple deposition phases (e.g., within different chamber zones and/or at different times) may be followed with a single oxidation phase. In still other embodiments, multiple metal precursors may be co-flowed (e.g., within the first chamber zone) within a single ALD cycle.

Figure 2:
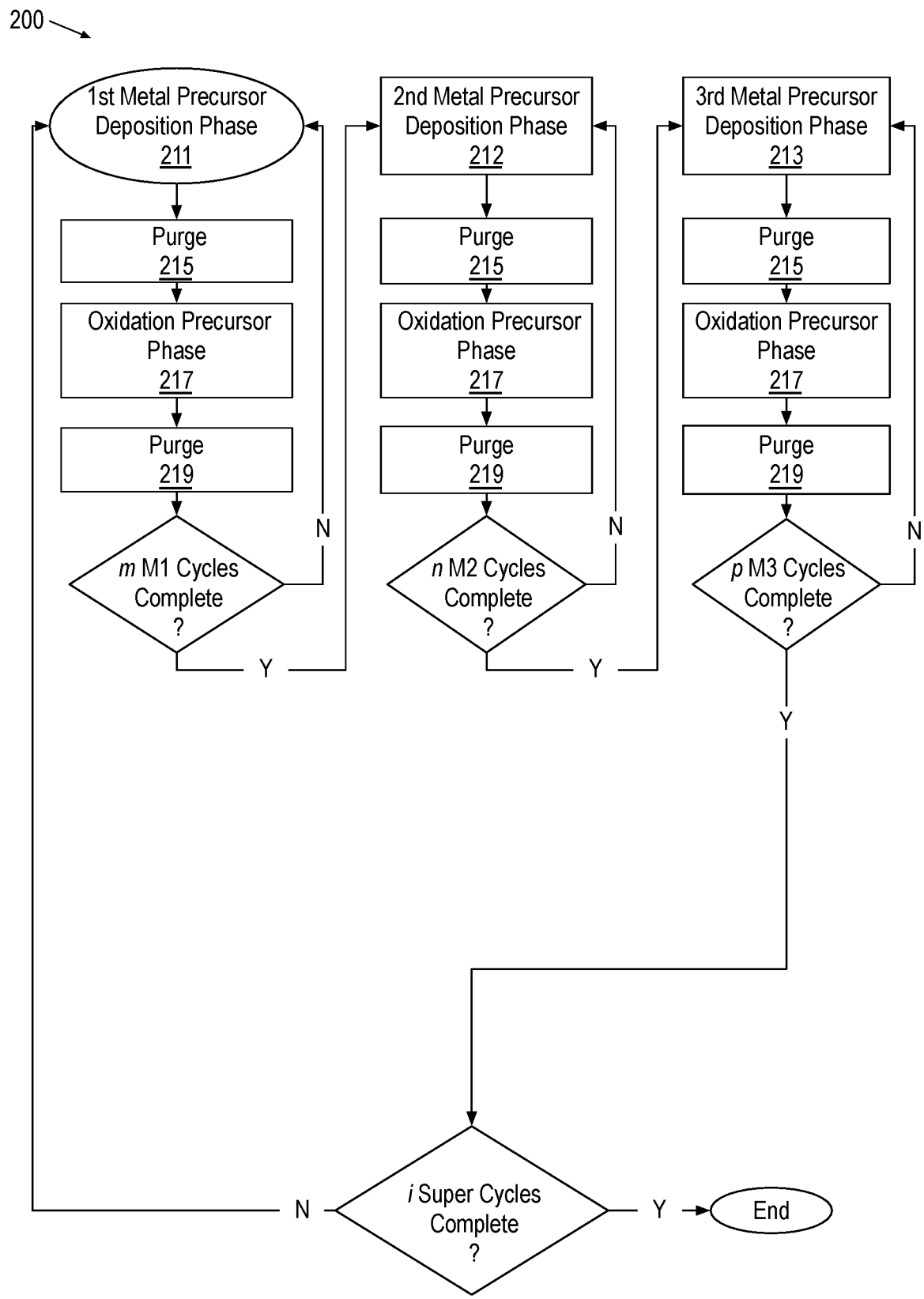
FIG. 2 is a flow diagram illustrating methods of depositing a metal oxide channel material with an ALD deposition process, in accordance with some embodiments.

FIG. 2 is a flow diagram illustrating methods 200 for depositing a metal oxide channel material with ALD, in accordance with some embodiments. Methods 200 may be practiced at block 110 of methods 101, for example. Methods 200 may also be practiced as a deposition technique enlisted in methods other than methods 101. Likewise, the practice of methods 200 is not required in the practice of methods 101. In exemplary embodiments, methods 200 are performed in one or more ALD chambers, such as an SALD chamber similar to that depicted in FIG. 1B.

Methods 200 begin at input 211 where a first metal precursor deposition phase is executed. At input 211, a first metal precursor is supplied and the precursor adsorbs to available sites on a surface of a substrate exposed to the first metal precursor. The first metal precursor may be a first of any of those listed above, for example. At block 215, a purge gas is supplied to flush away any excess first metal precursor and/or reaction byproducts from the surface of the substrate and/or the ALD chamber volume. At block 217, a reactive oxygen (oxidizing) precursor is supplied and the oxygen precursor reacts with the adsorbed first metal precursor to form a monolayer of metal oxide comprising the first metal. At block 219, a purge gas is again supplied to flush away any excess oxygen precursor and/or reaction byproducts from the surface of the substrate and/or the ALD chamber volume. The purges performed at blocks 215 and 219 may be the same or different, for example employing the same, or different, purge gases, etc.

Input 211 and blocks 215, 217 and 219 may each be performed once as a single M1 ALD cycle forming a $M1O_x$. Any number n of the M1 ALD cycles may be performed successively to deposit a metal oxide having a desired atomic (elemental) composition ratio of multiple metals. Hence, methods 200 may iterate through n M1 cycles before advancing to subsequent ALD cycles where other metal precursors are introduced.

As further illustrated in FIG. 2, methods 200 continue at block 212 where a second metal precursor is supplied, and the precursor adsorbs to available sites on a surface of the substrate exposed to the second metal precursor. The second metal precursor may be second of any of those listed above, for example. At block 215, the purge gas is supplied to flush away any excess second metal precursor and/or reaction byproducts from the surface of the substrate and/or the ALD chamber volume. At block 217, a reactive oxygen (oxidizing) precursor is supplied and the oxygen precursor reacts with the adsorbed second metal precursor to form a monolayer of metal oxide comprising the second metal. At block 219, a purge gas is again supplied to flush away any excess oxygen precursor and/or reaction byproducts from the surface of the substrate and/or the ALD chamber volume.

The blocks 212, 215, 217 and 219 may each be performed once as a single M2 ALD cycle forming a $M2O_x$. Any number m of the M2 cycles may be performed. Methods 200 may therefore again iterate through m M2 cycles before advancing to subsequent ALD cycles where other metal precursors are introduced. For example, the ratio of n:m may be approximately equal to a desired atomic composition ratio of the two metals M1:M2. In an embodiment where M1 is In, for example, and M2 is Ga, a Ga-rich composition can be deposited with m being greater n. For some advantageous embodiments where a Ga:In atomic ratio of 1.5-2.5 is desired, m:n may similarly be 1.5-2.5.

As further illustrated in FIG. 2, methods 200 continue at block 213 where a third metal precursor is supplied, and the precursor adsorbs to available sites on a surface of the substrate exposed to the third metal precursor. The third metal precursor may be third of any of those listed above, for example. At block 215, the purge gas is supplied to flush away any excess third metal precursor and/or reaction byproducts from the surface of the substrate and/or the ALD chamber volume. At block 217, a reactive oxygen (oxidizing) precursor is supplied and the oxygen precursor reacts with the adsorbed third metal precursor to form a monolayer of metal oxide comprising the third metal. At block 219, a purge gas is again supplied to flush away any excess oxygen precursor and/or reaction byproducts from the surface of the substrate and/or the ALD chamber volume.

The blocks 213, 215, 217 and 219 may each be performed once as a single M3 ALD cycle forming a $M3O_x$. Any number p of the M3 ALD cycles may be performed successively to deposit a metal oxide having a desired atomic (elemental) composition ratio of multiple metals. Methods 200 may therefore again iterate through p M3 cycles before advancing to subsequent ALD cycles where other metal precursors are introduced. For example, the ratio of n:m:p may be approximately equal to a desired atomic composition ratio of the three metals M1:M2:M3. In an embodiment where M1 is In, M2 is Ga, and M3 is Zn, for example, a Ga-rich composition can be deposited with m being greater than both n and p. The ratio of n:p may be varied to achieve any ternary atomic ratios. For some advantageous embodiments where a In:Zn atomic ratio of 0.75-1.25 is desired, n:p may similarly be 0.75-1.25.

With composition ratios controlled based on the number of iterations through each of multiple metal oxide ALD cycles, a desired composition ratio may be maintained for any desired thin film material thickness by iterating through a number of i ALD super cycles. In each super cycle iteration, m M1 cycles, n M2 cycles, and p M3 cycles are performed. Although FIG. 2 illustrates ALD methods suitable for depositing a quaternary IGZO film (a ternary metal alloy with oxygen), methods 200 may be modified to include more or less ALD cycles as a function of the number of different metal constituents (e.g., binary, ternary, quinary, etc.).

Methods 200 end after the predetermined number of super cycles is completed, for example to arrive at a desired transistor channel material thickness. Although methods 200 allow for a substantially homogenous composition ratio throughout the thickness of a film, one may also grade the composition in any manner desired by varying the cycle numbers m, n, and p as a function of the super cycle number i.

Figure 3:
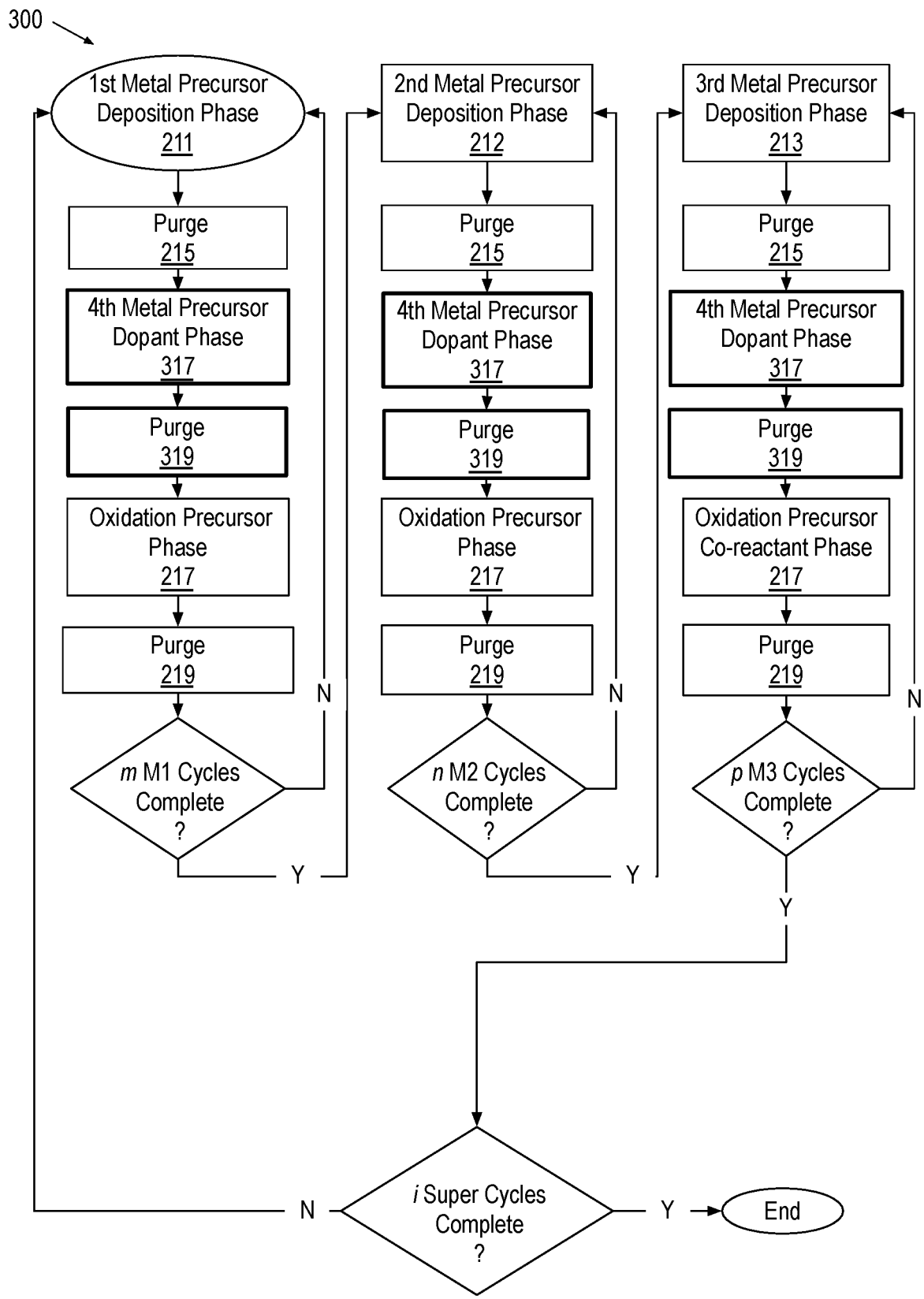
FIG. 3 is a flow diagram illustrating methods of in-situ doping a metal oxide channel material in an ALD process, in accordance with some embodiments.

FIG. 3 is a flow diagram illustrating methods 300 of in-situ doping a metal oxide channel material in an ALD process, in accordance with some embodiments. In methods 300, a secondary metal, such as Al, is introduced within an ALD cycle of a primary metal. A substrate may be first exposed to the primary metal precursor, and fewer surface sites will then be available to the secondary metal precursor. Methods 300 may be practiced at block 110 of methods 101, for example. Methods 300 may also be practiced as a deposition technique enlisted in methods other than methods 101. Likewise, the practice of methods 300 is not required in the practice of methods 101. In exemplary embodiments, methods 300 are performed in one or more ALD chambers, such as an SALD chamber similar to that depicted in FIG. 1B.

Methods 300 generally include the three exemplary metal ALD cycles substantially as described above in the context of methods 200, but with the further introduction of a fourth reactive metal precursor at blocks 317, and an additional precursor purge at blocks 319. For clarity, blocks 317 and 319 in FIG. 3 are outlined in heavier line with the remaining blocks in lighter line being substantially the same as those in FIG. 2.

As shown, methods 300 again begin at input 211 where a first metal precursor deposition phase is executed. At input

211, a first metal precursor is supplied and the precursor adsorbs to available sites on a surface of a substrate exposed to the first metal precursor. The first metal precursor may be a first of any of those listed above, for example. At block 215, a purge gas is supplied. At block 317, a metal precursor comprising the metal that is to be incorporated at a lesser (i.e., dopant) concentration is supplied, which adsorbs to some number of surface sites left unfilled by the first metal precursor. The dopant metal precursor is Al in some advantageous embodiments. At block 319, a purge gas is supplied to flush away any excess fourth metal precursor and/or reaction byproducts from the surface of the substrate and/or the ALD chamber volume. The M1 cycle continues at block 217, where the reactive oxygen (oxidizing) precursor is supplied and the oxygen precursor reacts with both the first metal precursor and dopant metal precursor to form a monolayer of metal oxide comprising the first metal and the dopant metal. At block 219, a purge gas is again supplied to flush away any excess oxygen precursor and/or reaction byproducts from the surface of the substrate and/or the ALD chamber volume.

Any number n of the first ALD cycles may be performed successively to deposit a $M1(M4)O_x$ with each of input 211 and blocks 215, 317, 319, 217 and 219 performed once as a single M1 ALD cycle. Methods 300 may again iterate through m M1 cycles before advancing to subsequent ALD cycles where other metal precursors are introduced.

As further illustrated in FIG. 3, methods 300 continue at block 212 where the second metal precursor is supplied. The second metal precursor may be second of any of those listed above, for example. At block 215, a purge gas is supplied. At block 317, the dopant metal precursor comprising the dopant metal is supplied, which adsorbs to some number of surface sites left unfilled by the second metal precursor. At block 319, a purge gas is supplied to flush away any excess dopant metal precursor and/or reaction byproducts from the surface of the substrate and/or the ALD chamber volume. The M2 cycle then continues at block 217, where the reactive oxygen (oxidizing) precursor is supplied and the oxygen precursor reacts with both the second metal precursor and dopant metal precursor to form a monolayer of metal oxide comprising the second metal and the dopant metal. At block 219, a purge gas is again supplied to flush away any excess oxygen precursor and/or reaction byproducts from the surface of the substrate and/or the ALD chamber volume.

The blocks 212, 215, 317, 319, 217 and 219 may each be performed once as a single ALD cycle forming a $M2(M4)O_x$. Any number n of the second cycles may be performed. Methods 300 may therefore again iterate through n M2 cycles before advancing to subsequent ALD cycles where other metal precursors are introduced. For example, the ratio of m:n may be approximately equal to a desired atomic composition ratio of the two metals M1:M2 (e.g., Ga:In atomic ratio of 1.5-2.5).

As further illustrated in FIG. 3, methods 300 continue at block 213 where the third metal precursor is supplied. The third metal precursor may be third of any of those listed above, for example. At block 215, a purge gas is supplied. At block 317, the dopant metal precursor comprising the dopant metal is supplied, which adsorbs to some number of surface sites left unfilled by the third metal precursor. At block 319, a purge gas is supplied to flush away any excess dopant metal precursor and/or reaction byproducts from the surface of the substrate and/or the ALD chamber volume. The M3 cycle then continues at block 217, where the reactive oxygen (oxidizing) precursor is supplied and the oxygen precursor reacts with both the third metal precursor and dopant metal precursor to form a monolayer of metal oxide comprising the third metal and the dopant metal. At block 219, a purge gas is again supplied to flush away any excess oxygen precursor and/or reaction byproducts from the surface of the substrate and/or the ALD chamber volume.

The blocks 213, 215, 317, 319, 217 and 219 may each be performed once as a third ALD cycle forming a $M3(M4)O_x$. Any number p of the M3 cycles may be performed. Methods 300 may therefore again iterate through p M3 cycles before advancing to subsequent ALD cycles where other metal precursors are introduced. For example, the ratio of m:n:p may be approximately equal to a desired atomic composition ratio of the three metals M1:M2:M3 (e.g., Ga:In:Zn atomic ratio of 1.5-2.5:0.75-1.25:0.75-1.25). For examples where the dopant metal is Al, the film deposited by methods 300 may again be IGZAO. Although the concentration of Al may be varied, in some exemplary embodiments the Ga:Al composition ratio is in the range of about 8-50. In some such embodiments, Al is no more than 5 at. % of the metals present with the metal oxide deposited by methods 300.

A desirable composition ratio may be maintained for any desired thin film material thickness by iterating through i super cycles. In each super cycle iteration, m M1(M4) cycles, n M2(M4) cycles, and p M3(M4) cycles are performed. Methods 300 end after the predetermined number of super cycles is completed, for example to arrive at a desired transistor channel material thickness. Although methods 300 allow for a substantially homogenous composition ratio throughout the thickness of a film, one may also grade the composition in any manner desired by varying the cycle numbers m, n, and p as a function of the super cycle number i. In the illustrated example, the ALD cycle for each of the three primary metal constituents further includes blocks 317 where the dopant metal precursor is introduced. However, block 317 may instead be included in fewer than all of the ALD cycles performed in a given super cycle. If desired, the dopant metal concentration may be graded over the thin film thickness by adding or excluding the blocks 317, 319 from one or more of the M1, M2 or M3 ALD cycles as a function of the super cycle number i.

Figure 4:
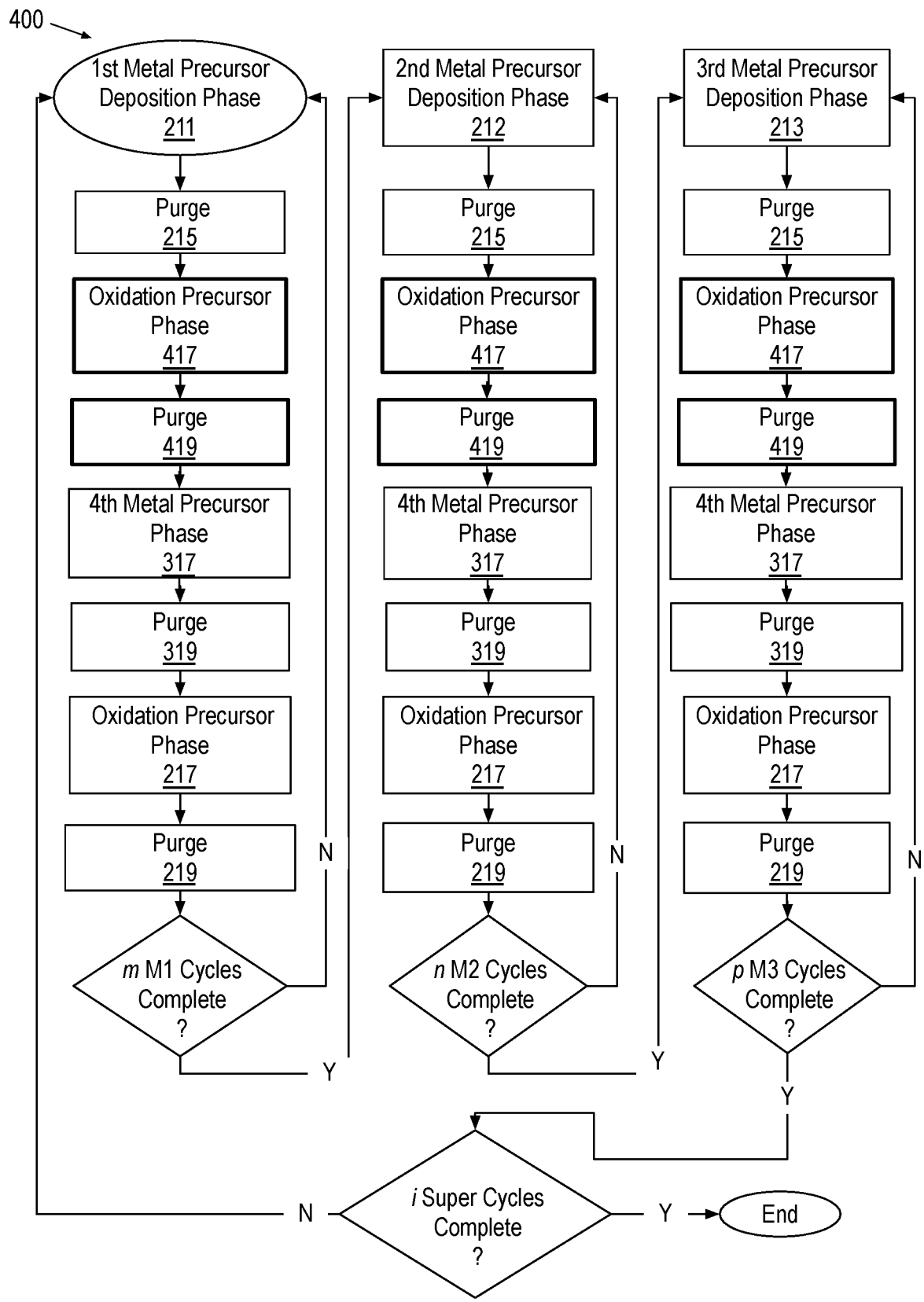
FIG. 4 is a flow diagram illustrating methods of in-situ doping a metal oxide channel material in an ALD process, in accordance with some embodiments.

An in-situ dopant metal deposition may also be appended into one or more deposition cycles of the primary metal constituents. FIG. 4 is a flow diagram illustrating methods 400 for in-situ doping a metal oxide channel material in an ALD process, in accordance with some embodiments. In methods 400, a secondary metal, such as Al, is introduced within an ALD cycle of a primary metal with each of the two metal precursors being followed by a separate oxidation phase. Methods 400 may be practiced at block 110 of methods 101, for example. Methods 400 may also be practiced as a deposition technique enlisted in methods other than methods 101. Likewise, the practice of methods 400 is not required in the practice of methods 101. In exemplary embodiments, methods 400 are performed in one or more ALD chambers, such as an SALD chamber similar to that depicted in FIG. 1B.

Methods 400 generally include the three exemplary metal ALD cycles substantially as described above in the context of methods 300 (FIG. 3), but with the further introduction of an additional oxidation phase at blocks 417, and an additional precursor purge at blocks 419. For clarity, blocks 417 and 419 in FIG. 4 are outlined in heavier line with the remaining blocks in lighter line being substantially the same as those in FIG. 3.

Methods 400 again begin at input 211 where a first metal precursor deposition phase is executed. The first metal precursor may be first of any of those listed above, for example. At block 215, a purge gas is supplied. At block 417, a reactive oxygen (oxidizing) precursor is supplied and the oxygen precursor reacts with the adsorbed first metal precursor to form a monolayer of metal oxide comprising the first metal. At block 419, a purge gas is supplied to flush away any excess oxygen precursor and/or reaction byproducts from the surface of the substrate and/or the ALD chamber volume.

At block 317, a dopant metal precursor, for example comprising a metal that is to be incorporated at a lesser (i.e., dopant) concentration, is adsorbed to substrate surface sites. In some advantageous embodiments, the fourth metal precursor is Al. ALD process parameters (e.g., duration, partial pressures, temperatures, precursor composition, etc.) may be selected to control the efficiency with which surface sites are occupied so as achieve a target surface concentration. At block 319, a purge gas is supplied to flush away any excess dopant metal precursor and/or reaction byproducts from the surface of the substrate and/or the ALD chamber volume. The M1 cycle continues at block 217, where the reactive oxygen (oxidizing) precursor is supplied and the oxygen precursor reacts with the adsorbed dopant metal precursor to form a monolayer of metal oxide comprising the dopant metal. At block 219, a purge gas is again supplied to flush away any excess oxygen precursor and/or reaction byproducts from the surface of the substrate and/or the ALD chamber volume.

Any number m of such M1 cycles may be performed successively to deposit a $M1(M4)O_x$ from bottom up with each of input 211 and blocks 215, 417, 419, 317, 319, 217 and 219 performed once as a single ALD cycle. Methods 300 may again iterate through m M1 cycles before advancing to subsequent ALD cycles where other metal precursors are introduced.

As further illustrated in FIG. 4, methods 400 continue at block 212 where the second metal precursor is supplied. The second metal precursor may be second of any of those listed above, for example. At block 215, a purge gas is supplied. At block 417, a reactive oxygen (oxidizing) precursor is supplied and the oxygen precursor reacts with both the adsorbed second metal precursor to form a monolayer of metal oxide comprising the second metal. At block 419, a purge gas is supplied to flush away any excess oxygen precursor and/or reaction byproducts from the surface of the substrate and/or the ALD chamber volume.

At block 317, the dopant metal precursor comprising the dopant metal is supplied, which adsorbs to surface sites. At block 319, a purge gas is supplied to flush away any excess dopant metal precursor and/or reaction byproducts from the surface of the substrate and/or the ALD chamber volume. The M2 cycle then continues at block 217, where the reactive oxygen (oxidizing) precursor is supplied and the oxygen precursor reacts with the dopant metal precursor to form a monolayer of metal oxide comprising the dopant metal. At block 219, a purge gas is again supplied to flush away any excess oxygen precursor and/or reaction byproducts from the surface of the substrate and/or the ALD chamber volume.

The blocks 212, 215, 417, 419, 317, 319, 217 and 219 may each be performed once as a single ALD cycle forming a $M2(M4)O_x$. Any number n of such M2 cycles may be performed. Methods 400 may therefore again iterate through n M2 cycles before advancing to subsequent ALD cycles where other metal precursors are introduced. For example, the ratio of m:n may be approximately equal to a desired atomic composition ratio of the two metals M1:M2.

As further illustrated in FIG. 4, methods 400 continue at block 213 where the third metal precursor is supplied. The third metal precursor may be third of any of those listed above, for example. At block 215, a purge gas is supplied. At block 417, a reactive oxygen (oxidizing) precursor is supplied and the oxygen precursor reacts with both the adsorbed third metal precursor to form a monolayer of metal oxide comprising the third metal. At block 419, a purge gas is supplied to flush away any excess oxygen precursor and/or reaction byproducts from the surface of the substrate and/or the ALD chamber volume At block 317, the dopant metal precursor comprising the dopant metal is supplied. At block 319, a purge gas is supplied to flush away any excess dopant metal precursor and/or reaction byproducts from the surface of the substrate and/or the ALD chamber volume. The M2 cycle then continues at block 217, where the reactive oxygen (oxidizing) precursor is supplied and the oxygen precursor reacts with the dopant metal precursor to form a monolayer of metal oxide comprising the dopant metal. At block 219, a purge gas is again supplied to flush away any excess oxygen precursor and/or reaction byproducts from the surface of the substrate and/or the ALD chamber volume.

The blocks 213, 215, 417, 419, 317, 319, 217 and 219 may each be performed once as a single ALD cycle forming a $M3(M4)O_x$. Any number p of such M3 cycles may be performed. Methods 400 may therefore again iterate through p M3 cycles before advancing to subsequent ALD cycles where other metal precursors are introduced. For embodiments where the dopant metal is Al, the film deposited by methods 300 is IGZAO and the concentration of Al may be varied, for example substantially as described above.

A desirable composition ratio may be maintained for any thin film material thickness by iterating through i super cycles. In each super cycle iteration, m M1 cycles, n M2 cycles, and p M3 cycles are performed. Methods 400 end after the predetermined number of super cycles is completed, for example to arrive at a desired transistor channel material thickness. Although methods 400 allow for a substantially homogenous composition ratio throughout the thickness of a film, one may also grade the composition in any manner desired by varying the cycle numbers m, n, and p as a function of the super cycle number i. In the illustrated example, the ALD cycle for each of the three primary metal constituents further includes blocks 317, 319, 417, and 419. However, these blocks may also be included in fewer than all of the ALD cycles performed in a given super cycle. If desired, the dopant metal concentration may be graded over the thin film thickness by adding or excluding the blocks 317, 319, 417, and 419 from one or more of the M1, M2 or M3 ALD cycles as a function of the super cycle number i.

In some other embodiments, an in-situ dopant may be introduced into an ALD process by performing a "hyper cycle" that further includes a dopant metal ALD cycle that is performed periodically after some number of super cycles are performed to deposit an oxidize the majority metal constituents. Within the hyper cycle, the frequency of the dopant ALD cycle may be modulated relative to the number of intervening super cycles executed to disperse the dopant metal throughout the metal oxide thin film at some desired concentration.

Figure 5:
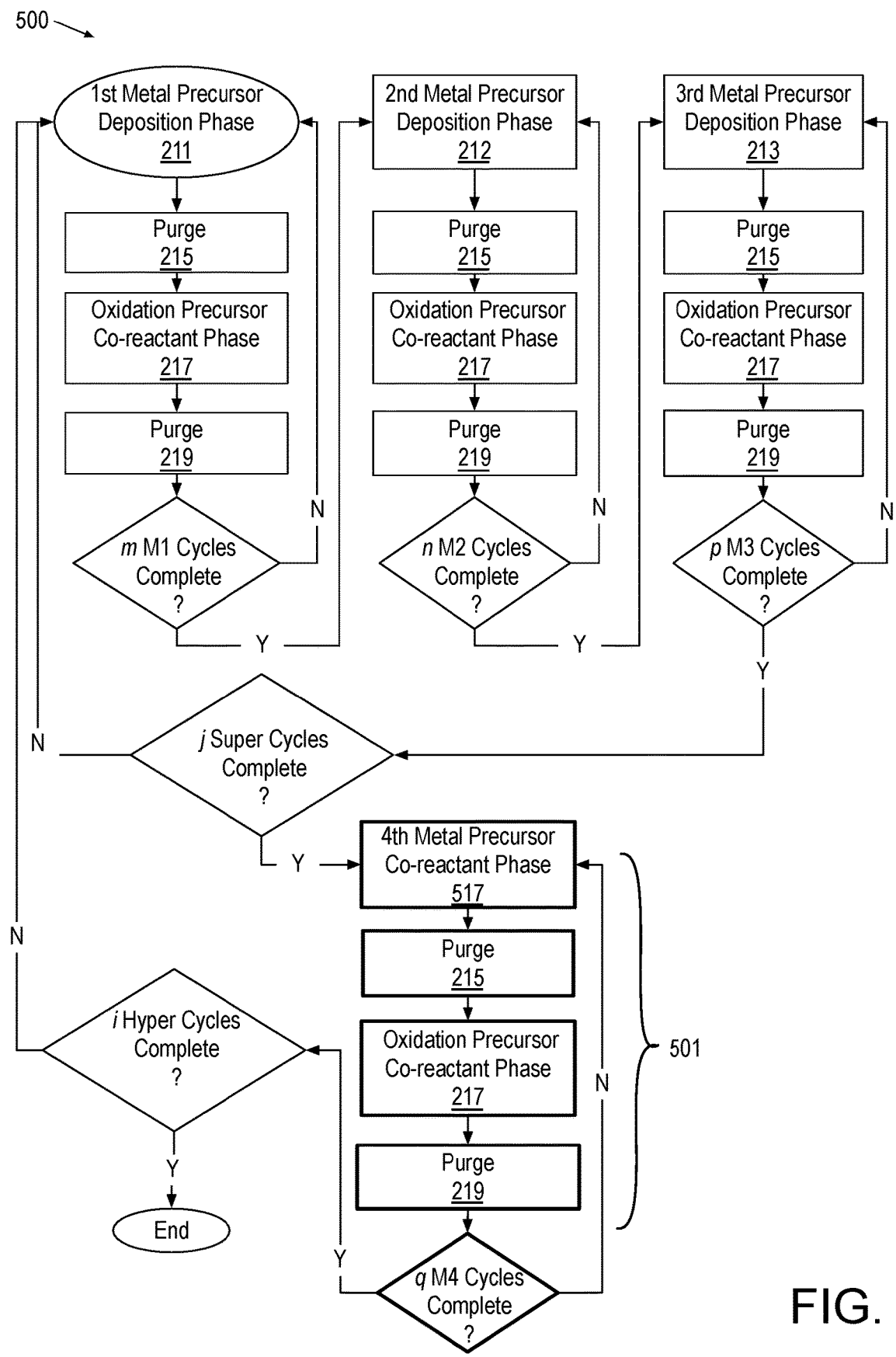
FIG. 5 is a flow diagram illustrating methods of in-situ doping a metal oxide channel material in an ALD process, in accordance with some embodiments.

FIG. 5 is a flow diagram illustrating methods 500 for in-situ doping a metal oxide channel material in an ALD process, in accordance with some hyper-cycle embodiments. Methods 500 may be practiced at block 110 of methods 101, for example. Methods 500 may also be practiced as a deposition technique enlisted in methods other than methods 101. Likewise, the practice of methods 500 is not required in the practice of methods 101. In exemplary embodiments, methods 500 are performed in one or more ALD chambers, such as an SALD chamber similar to that depicted in FIG. 1B.

Methods 500 generally include the three exemplary metal ALD cycles substantially as described above in the context of methods 200 (FIG. 2), but with the further introduction of an additional dopant metal ALD cycle 501 that includes blocks 517, 215, 217 and 219. For clarity, the blocks of cycle 501 are outlined in heavier line with the remaining blocks in lighter line being substantially the same as those in FIG. 2.

As shown in FIG. 5, each of the M1, M2 and M3 ALD cycles are performed substantially as described above (e.g., in context of methods 200). However, after j super cycles are completed, methods 500 continue with executing the dopant (M4) metal ALD cycle 501. At block 517, the dopant metal precursor comprising the dopant metal is supplied. At block 215, a purge gas is supplied to flush away any excess dopant metal precursor and/or reaction byproducts from the surface of the substrate and/or the ALD chamber volume. The M4 cycle then continues at block 217, where the reactive oxygen (oxidizing) precursor is supplied and the oxygen precursor reacts with the dopant metal precursor to form a monolayer of metal oxide comprising the dopant metal. At block 219, a purge gas is again supplied to flush away any excess oxygen precursor and/or reaction byproducts from the surface of the substrate and/or the ALD chamber volume.

The dopant ALD cycle 501 may be performed once forming a monolayer of $M4O_x$. However, any number q of such M4 cycles may be performed. Methods 500 may therefore again iterate through q M4 cycles before advancing through another super cycle iteration where the primary metal precursors are again introduced. For examples where the primary metals M1, M2 and M3 are each one of In, Ga, and Zn, and the dopant metal is Al, the film deposited by methods 500 is again IGZAO. The concentration of Al may be varied, for example, by setting the ratio of super cycle number j to dopant cycle number q. For example, where metal M2 is to be 8-50 times the dopant concentration, the number n*j may be set to 8-50 times the dopant cycle number q.

A desirable composition ratio may be maintained for any thin film material thickness by iterating through i hyper cycles. In each hyper cycle iteration, m M1 cycles, n M2 cycles, p M3 cycles are performed for each j super cycle and for each q M4 cycle. Methods 500 end after the predetermined number of hyper cycles is completed, for example to arrive at a desired transistor channel material thickness. Although methods 500 allow for a substantially homogenous composition ratio throughout the thickness of a film, one may also grade the composition in any manner desired by varying the cycle numbers m, n, p, q, and j as a function of the hyper cycle number i. For example, the dopant metal concentration may be graded over the thin film thickness by increasing of decrease q as a function of the hyper cycle number i.

Figure 6:
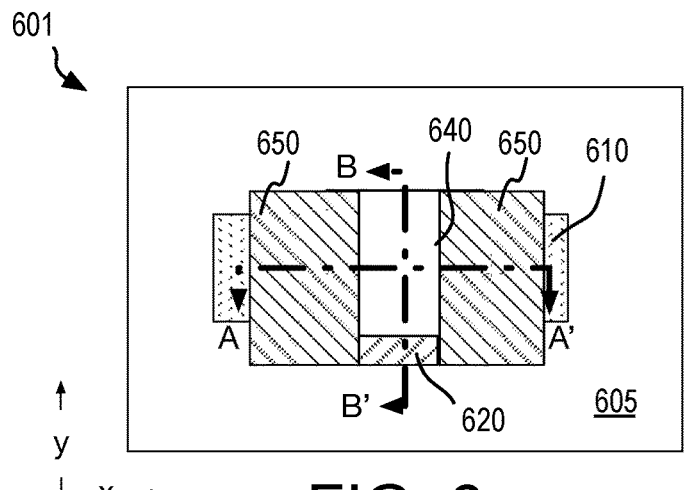
FIG. 6 is a plan view of a transistor structure including an in-situ doped metal oxide channel material, in accordance with some embodiments.

As previously noted, the above techniques for depositing in-situ doped metal oxide materials may be applied to a wide variety of transistor architectures. FIG. 6 is a plan view of a transistor structure 601 including an in-situ doped channel semiconductor material 610, in accordance with some embodiments. In FIG. 2, heavy dot-dashed lines denote planes A-A' and B-B' along which cross-sectional views are further provided for various embodiments described below. Transistor structure 601 may be arrayed over an area of a device layer within IC die, for example. Transistor structure 601 is a thin film field effect transistor (FET) with a source terminal, a drain terminal, and a gate terminal, in accordance with some illustrative embodiments. These terminals are at least in part electrically coupled through channel material 610 that may have one or more of the attributes described above in the context of methods 101, 200, 300, 400 or 500, for example. Transistor structure 601 may have a planar architecture, or a non-planar architecture. Non-planar examples include a fin structures, nanowire/ribbons or other multi-gate structures. For both planar and non-planar architectures, the channel carrier conduction may be laterally oriented in the plane of a device layer (e.g., transistor structure 601) or vertically oriented, for example as described further below.

In FIG. 6, metal oxide channel material 610 extends over an area of a substrate 605. Although only one body of channel material 610 is illustrated in FIG. 6, a TFT may include one or more bodies Channel material 610 may have any metal oxide composition, such as those described above. In some embodiments, channel material 610 is IGZAO, including predominantly O, In, Ga, Zn, and a lesser amount of Al as a metallic dopant that is advantageously introduced in-situ with deposition of the majority metal constituents. In specific embodiments, the atomic composition ratio of Ga to each of In and Zn is in the range of 1.5-2.5 and the atomic composition ratio of Ga to Al, may be, for example in the range of 8-50. Of the metals present in metal oxide channel material 610, Al is less than 10 at. %, and advantageously no more than 5 at. %. In specific examples, Al is 1-5 at. % of the metals present in metal oxide channel material 610. Each of In and Zn may be at least 20 at. % of the metals present in metal oxide channel material 610. For some Ga-rich embodiments (e.g., with Ga being 40-50 at. % of the metals present in the channel material), each of In and Zn is less than 25 at. % of the metals present in metal oxide channel material 610.

As further illustrated in FIG. 6, a gate electrode 620 over/underlaps a channel region of channel material 610. Gate electrode 620 may include an elemental metal layer, a metal alloy layer, or laminate structure of either or both. Gate electrode 620 may have any composition suitable for a particular channel semiconductor material and target threshold voltage. As one example, gate electrode 620 includes a metal nitride, such as TiN, or other work function metal. The gate electrode may also comprise Al (e.g., TiAlN). Other alloy constituents may also be employed in gate electrode 620, such as, but not limited to C, Ta, W, Pt, and Sn. Additional metal(s) may be employed in a bulk conductor layer to reduce gate electrode electrical resistance.

With a lateral channel layout, source/drain metallization 650 is adjacent to gate electrode 620 and also intersects ends of channel material 610 that are on opposite sides of gate electrode 620. Source/drain metallization 650 may be in direct contact with channel material 610. Alternatively, there may be an intervening source/drain semiconductor (not depicted), which is further in contact with channel material 610. Source/drain metallization 650 may include one or more metals that form an ohmic or tunneling junction directly to channel material 610, or to an intervening source/drain semiconductor material. Source/drain metallization 650 may comprise any metal. Examples include Ti, W, Ru, Pt, their alloys, and nitrides. Source/drain semiconductor material, if present, may be any semiconductor material compatible with channel material 610.

Figure 7A:
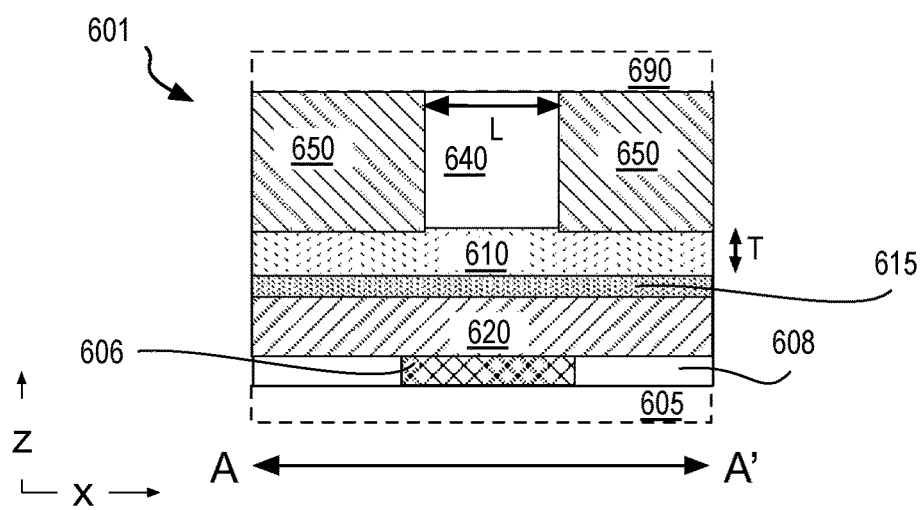
FIG. 7A is a cross sectional view of the transistor structure along the A-A' line introduced in FIG. 6, in accordance with some embodiments.
Figure 7B:
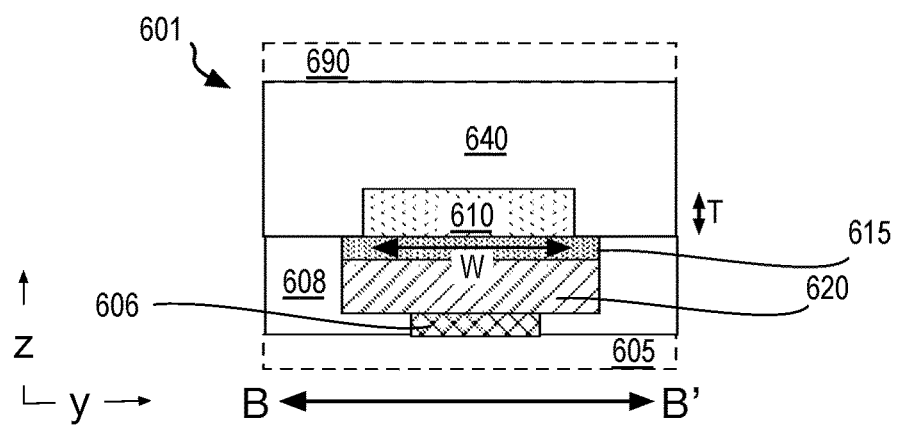
FIG. 7B is a cross sectional view of the transistor structure along the B-B' line introduced in FIG. 6, in accordance with some embodiments.

FIG. 7A further illustrates TFT structure 601 along the A-A plane denoted in FIG. 6. FIG. 7B further illustrates TFT structure 601 along the B-B plane denoted in FIG. 6. As shown in FIGS. 7A and 7B, gate electrode 620 is on a bottom side of channel material 610, and source/drain contact metallization 650 is on a top side of channel material 610. Gate electrode 620 is embedded within a dielectric material 608, which may be any suitable material such as, but not limited to, silicon dioxide, silicon nitride, or silicon oxynitride, a low-k material having a relative permittivity below 3.5, for example, or a dielectric metal oxide. Dielectric material 608 is over substrate 605, which is illustrated in dashed line to emphasize that substrate 605 may include any number of FEOL material and/or circuitry levels. A conductive interconnect via 606 electrically couples gate electrode 620 to circuitry within substrate 605. Source/drain contact metallization 650 is embedded within a dielectric material 640, which may be any suitable material (e.g., silicon dioxide, silicon nitride, or silicon oxynitride, or a low-k material). Any number of FEOL material and/or circuitry levels 690 may be over dielectric material 640.

In the "bottom-gate" architecture illustrated for TFT 601, transistor channel length L is dependent on the spacing of source/drain contact metallization 650, which may be defined by some minimum lithographic feature resolution (e.g., 10-20 nm pitch). Length L is independent of gate length (e.g., x-dimension) in this bottom-gate architecture, so gate electrode 620 may extend under source/drain metallizations 650 by an arbitrary amount, and may even be present over the entire area under channel material 610.

Channel material 610 may have any thickness T, but in some exemplary embodiments is in the range of 2-20 nm. Gate dielectric 615 may be any material(s) suitable for the compositions of metal oxide channel material 610 and gate electrode 620. Together, gate electrode 620 and gate dielectric 615 are referred to as a gate stack. While any gate stack materials known to be suitable for a metal oxide channel material may be utilized, in some exemplary embodiments the gate stack includes a high-k dielectric material (with a bulk relative permittivity greater than 9), and a metal gate electrode having a work function suitable for metal oxide channel material 610 having the compositions described elsewhere herein. Exemplary high-k materials include metal oxide insulators, such as, but not limited to $GaO_x$ (comprising predominantly Ga and O), $AlO_x$ (comprising predominantly Al and O), $HfO_x$ (comprising predominantly Hf and O), $HfAlO_x$ (comprising predominantly Al, Hf, and O). Silicates, such as, but not limited to $HfSiO_x$, or $TaSiO_x$ may also be suitable. Although a MOSFET architecture is shown in FIG. 7a, a bottom gate may be similarly employed in a MESFET structure where gate dielectric 615 is absent, and gate electrode 620 is instead in direct contact with metal oxide channel material 610. As further illustrated in FIG. 7B, FET structure 601 has a channel width W associated with a second lateral dimension of metal oxide channel material 610.

The plan view of TFT structure 601 (FIG. 6) is applicable to a number of alternative transistor architectures, some of which are further described in the context of FIG. 8-12. For the sake of clarity, reference numbers are repeated for features that share the same attributes (e.g., material composition, morphology, etc.) as those previously introduced.

Figure 8:
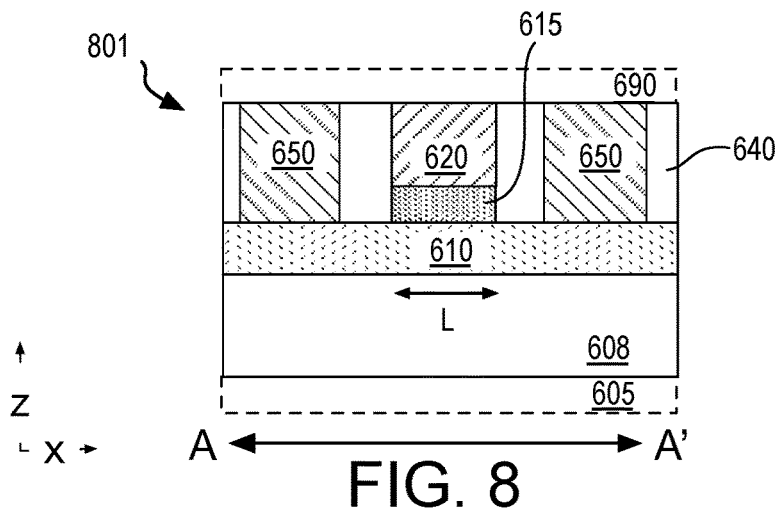
FIGS. 8, 9, 10, 11, and 12 are cross-sectional views of transistor structures including an in-situ doped metal oxide channel material, in accordance with some alternative embodiments.

FIG. 8 illustrates an exemplary transistor structure 801 that includes a top-side gate electrode 620 along with top-side source/drain contact metallization 650. In this MOSFET architecture, gate dielectric 615 is again between gate electrode 620 and metal oxide channel material 610. As noted in FIG. 8, top-gate transistor channel length L is dependent on physical dimensions of gate electrode 620 and also a lateral spacing between electrode 620 and source/drain contact metallization 650.

Figure 9:
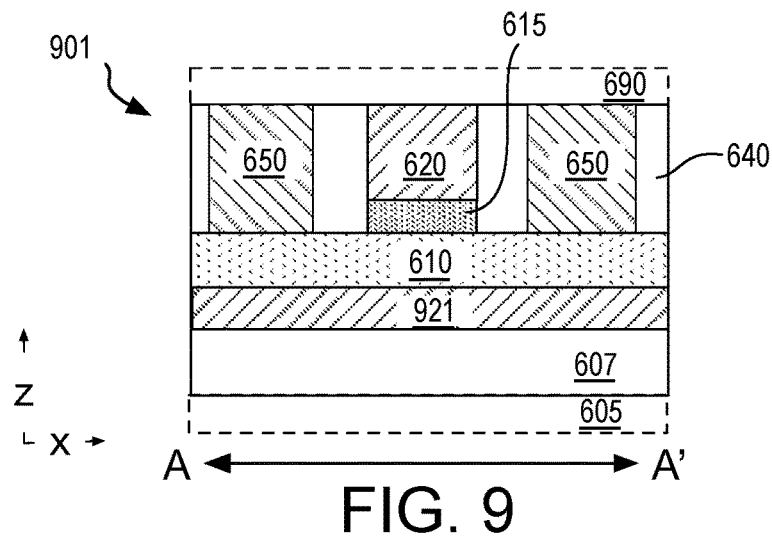

FIG. 9 illustrates a cross-sectional view of a four terminal transistor structure 901, in accordance with some embodiments. In transistor structure 901, a bias gate 921 is added to the top-side three terminal transistor structure 801 (FIG. 8). Bias gate 921 is in contact with a bottom side of channel material 610, opposite gate electrode 620. In this example, bias gate 921 may set a body potential for channel material 610 independent of any gate potential applied to gate electrode 620. Bias gate 921 forms a metal-semiconductor junction with a bottom surface of channel material 610. Bias gate 921 may therefore have any metal composition having a suitable bandgap offset with channel material 610. The four-terminal architecture of transistor structure 901 may also be modified so as to add a gate dielectric (not depicted) between bias gate 921 and channel material 610. Bias gate 921 may then be electrically tied to gate electrode 620 and operable as a portion of a double-gate.

Figure 10:
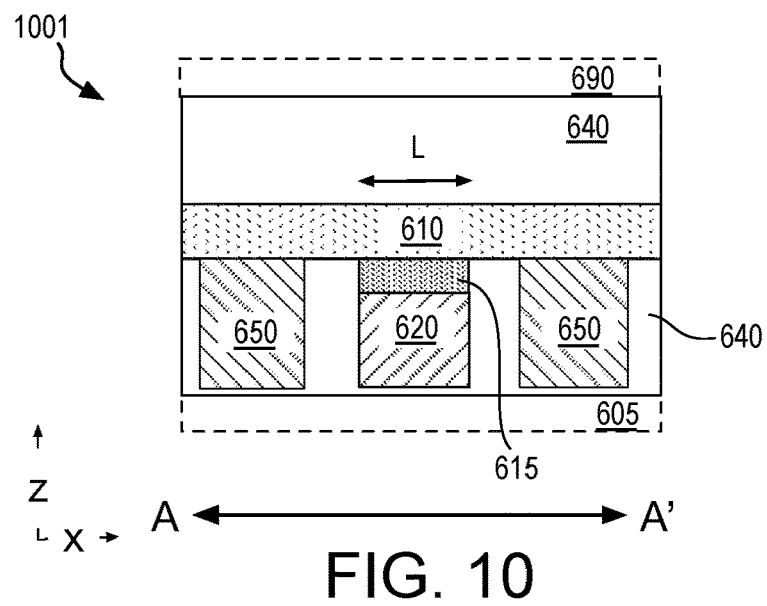

FIG. 10 illustrates a transistor structure 1001 that includes a bottom-side gate electrode 620 along with bottom-side source/drain contact metallization 650. In this architecture, gate dielectric 615 is again between gate electrode 620 and channel material 610. Similar to transistor structure 801, transistor channel length L is dependent on physical dimensions of gate electrode 620, and also a lateral spacing between gate electrode 620 and source/drain contact metallization 650.

Figure 11:
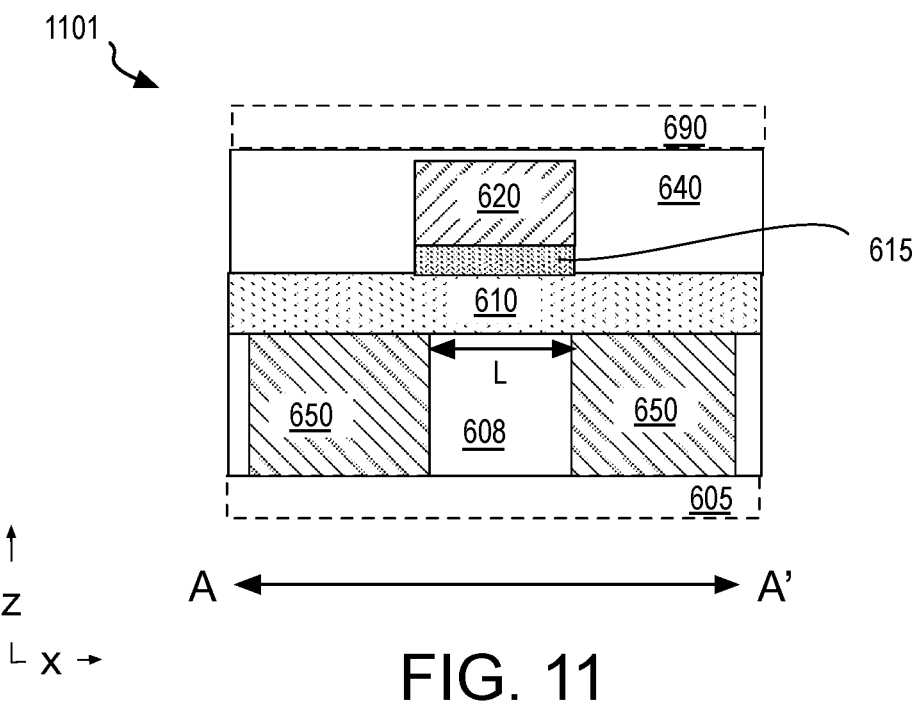
Figure 12:
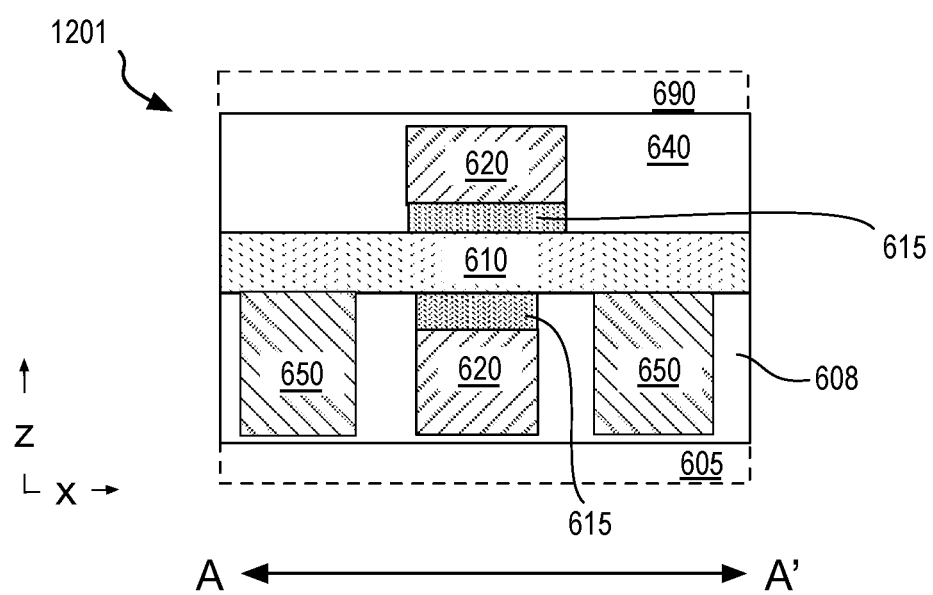

In FIG. 11, transistor structure 1101 comprises gate electrode 620 on a top-side of channel material 610 while source/drain contact metallization 650 is on a bottom side of channel material 610. Device terminals of transistor structure 1101 are inverted from those of transistor structure 601 (FIG. 7A-7B). As shown in FIG. 11, gate electrode 620 is therefore embedded within a dielectric material 640 while source/drain metallization 650 is embedded in dielectric material 608 on the side of substrate 605. In the "top-gate" architecture illustrated in FIG. 11, gate electrode 620 may extend over source/drain metallizations 650 by an arbitrary amount. FIG. 12 depicts a double gate transistor structure 1201 including gate dielectric 615 under, and over, channel material 610.

Non-planar TFT architectures are also possible and the ALD deposition techniques described herein have the advantage of being highly conformal. Metal oxide channel material formed with the ALD deposition techniques described herein may therefore maintain substantially the same thickness over any topography. For non-planar embodiments, a semiconductor channel material may be deposited over a topographic feature and scaling of such features can become limited by non-conformality of the channel material film thickness. For example, some transistor structures with a non-planar channel architecture include a semiconductor body that is adjacent to a sidewall of one or more transistor terminals (e.g., gate electrode), or mandrel structures. For non-planar architectures, the high conformality of the ALD deposition techniques described herein can be particularly advantageous.

Figure 13:
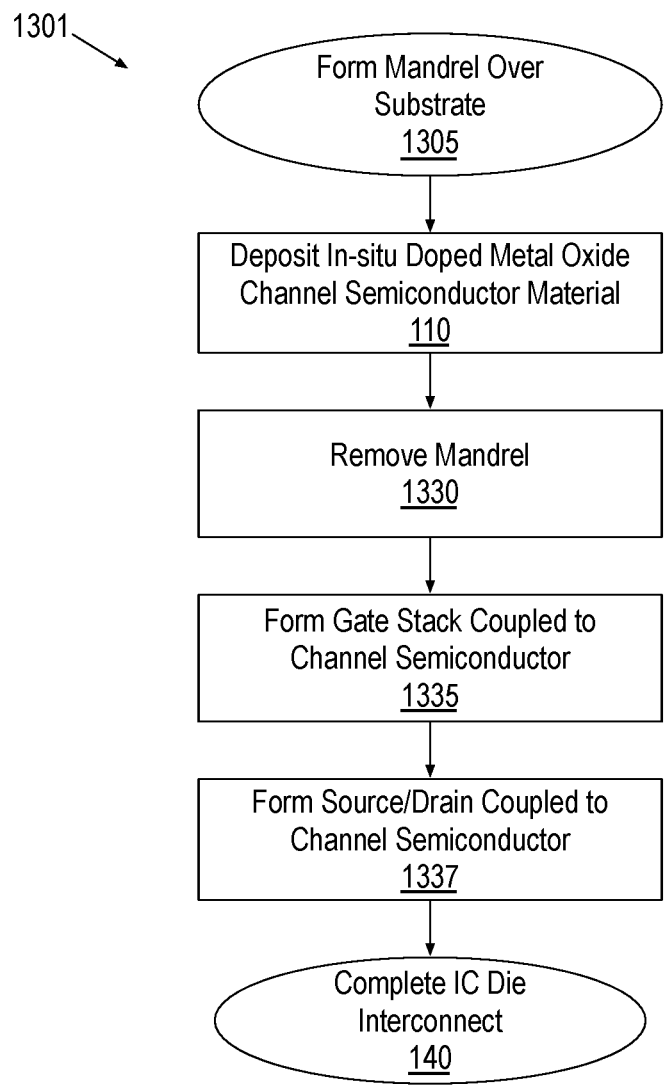
FIG. 13 is a flow diagram illustrating methods of fabricating transistor structures to include an in-situ doped metal oxide channel material, in accordance with some embodiments.

FIG. 13 illustrates a flow diagram for methods 1301 for fabricating transistor structures, in accordance with some non-planar TFT embodiments. Methods 1301 begin at input 1305 where a mandrel is formed over a substrate. The mandrel may be sacrificial, or a permanent feature of a transistor structure. In some embodiments, the mandrel comprises a dielectric material that is patterned into a feature, such as, but not limited to, a pillar, a line, or any other feature known to be suitable as a backbone doublepatterning (e.g., pitch splitting) process. For other embodiments, for example where the mandrel is to further functional as a terminal of the transistor structure, the mandrel may comprise any of a gate electrode (and gate dielectric), a source terminal contact metallization, or a drain terminal contact metallization.

Figure 14:
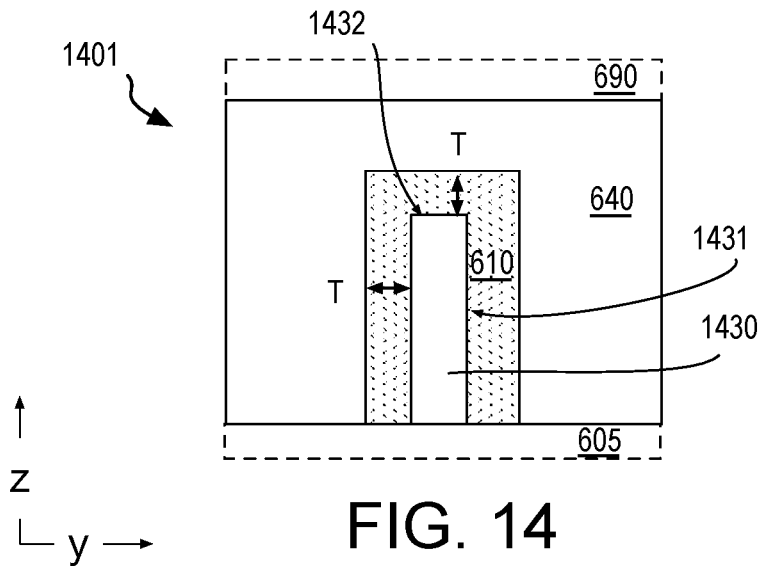
FIGS. 14, 15, and 16 are cross-sectional views of transistor structures including an in-situ doped metal oxide channel material, in accordance with some alternative embodiments.

Methods 1301 then proceed to block 110 where channel semiconductor is formed with an in-situ dopant, for example substantially as described above in the context of methods 101. For methods 1301 however, the channel material is formed adjacent to at least a sidewall of the mandrel, and in some embodiments the channel material is blanket deposited over the top surface and sidewall of the mandrel structure, as well as over a field portion of the substrate between adjacent mandrel structures. The conformality of the ALD process can achieve a metal oxide film of substantially equal thickness along both the sidewall of the mandrel and the field portion of the substrate. FIG. 14 further illustrates an exemplary transistor structure 1401 where metal oxide channel material 610 is retained on a mandrel structure 1430. Because of the conformality of ALD, channel material 610 has a thickness T that is substantially the same (e.g., less than 5% difference) both in a direction normal to sidewall 1431 and normal to a top surface 1432 that is substantially parallel to a plane of substrate 605.

Referring again to FIG. 13, methods 1301 may continue at block 1330 where the mandrel structure may be selectively removed for embodiments where the mandrel is sacrificial. A mandrel structure may be removed from the front or back side of the semiconductor body and replaced with another structure, such as a gate electrode structure, for example. In non-sacrificial mandrel embodiments of methods 1301, block 1330 may be skipped and a gate stack and source/drain terminals formed at blocks 1335 and 1337 according to any suitable technique(s). Methods 1301 may then be completed at block 140, substantially as described elsewhere herein. Therefore, in further reference to FIG. 14, mandrel structure 1430 may be permanent or a sacrificial feature ultimately removed from transistor structure 1401, for example with a selective etch, to expose channel material 610. Transistor structure 1401 includes a gate dielectric and gate electrode (not depicted) that is over the non-planar channel material 610. Formation of channel material 610 may be according to a variety of techniques including additive techniques (e.g. selective deposition) and subtractive techniques.

Figure 15:
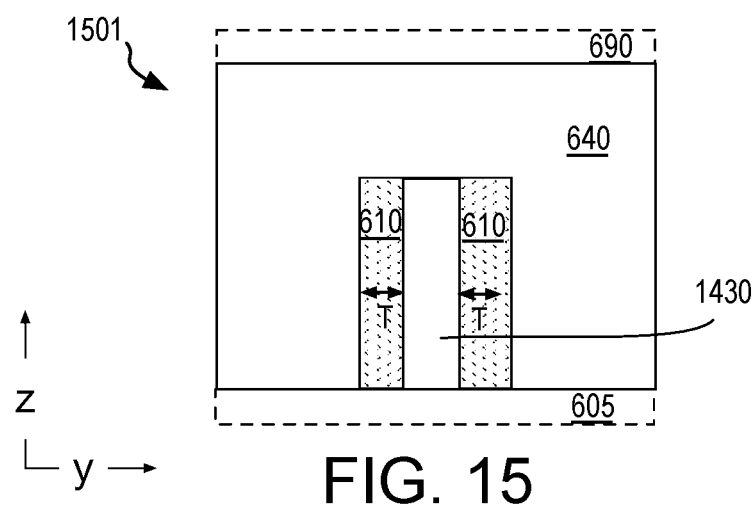

FIG. 15 illustrates another exemplary transistor structure 1501 that is similar to transistor structure 1401, however in transistor structure 1501, channel semiconductor material 610 has a top surface that is substantially planar with a top surface of mandrel structure 1430 (e.g., both have the same height). Transistor structure 1501 may be formed for example when an unpatterned anisotropic etch of channel material 610 exposes a top surface of mandrel structure 1430 so that channel material 610 is retained only as a self-aligned spacer along the sidewall of mandrel structure 1430. The resulting channel material 610 may be a single (e.g., cylindrical) structure. Alternatively, transistor structure 1501 may be patterned in the second planar dimension (e.g., x-dimension) so that transistor structure 1501 comprises two separate transistor channels that may be controlled by a single gate stack, for example.

Figure 16:
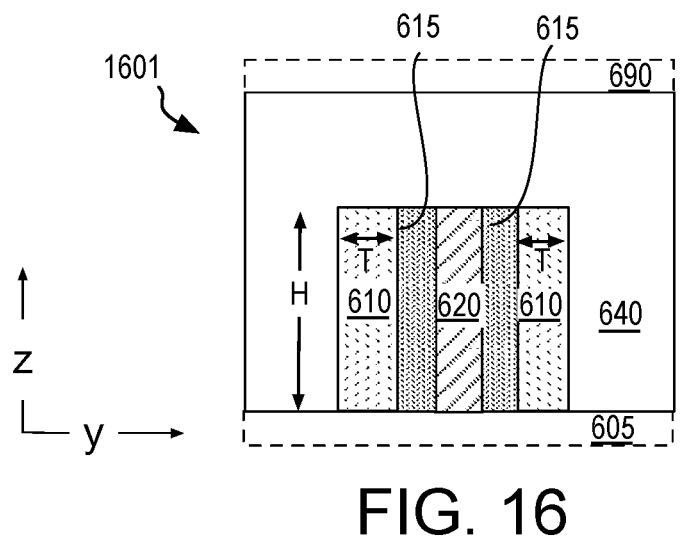

As noted above, a mandrel structure may be sacrificial. FIG. 16 further illustrates an alternative transistor structure 1601 where a mandrel structure was removed (e.g., from transistor structure 1501) prior to formation of gate dielectric 615 and gate electrode 620, which replace the mandrel structure. Gate electrode 620 and gate dielectric 615 may fill in between neighboring bodies of channel material 610, as shown in FIG. 16.

Figure 17:
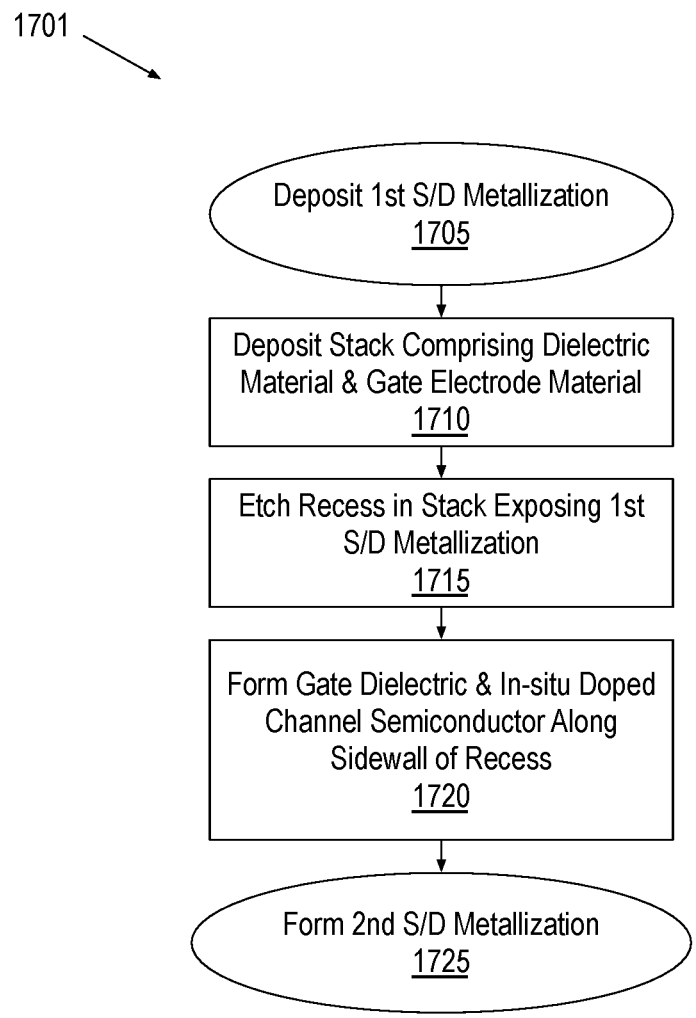
FIG. 17 is a flow diagram illustrating methods of fabricating transistor structures to include an in-situ doped metal oxide channel material, in accordance with some embodiments.

While the transistor structures including a planar or non-planar metal oxide channel material described above have a horizontal channel orientation (e.g., in one x-y plane), a transistor structure may also include a vertically-oriented channel where a first of the source or drain metallization is in a different x-y plane than a second of the source or drain metallization. For such vertically oriented non-planar architectures, channel semiconductor material vertically separates source metallization from drain metallization and may be advantageously deposited with a conformal ALD process as described elsewhere herein. In FIG. 17, for example, methods 1701 begin at input 1705 where a first source/drain metallization is formed over a substrate. At block 1710, a material stack including one or more layers of gate electrode material and one or more layers of any suitable dielectric material is deposited over the first source/drain metallization. A recess (e.g., a trench) is then formed through the material layer stack at block 1715, exposing the first source/drain metallization at a bottom of the recess. Methods 1701 continue at block 1720 where a gate dielectric is then formed over a sidewall of the gate electrode material layer(s) exposed within the recess Channel semiconductor material is deposited over the gate dielectric along a sidewall of the recess. With the conformality of the ALD process, the dimensions of such a recess can be minimized. The structure is capped with a second source/drain metallization to complete methods 1701 at block 1725.

Figure 18A:
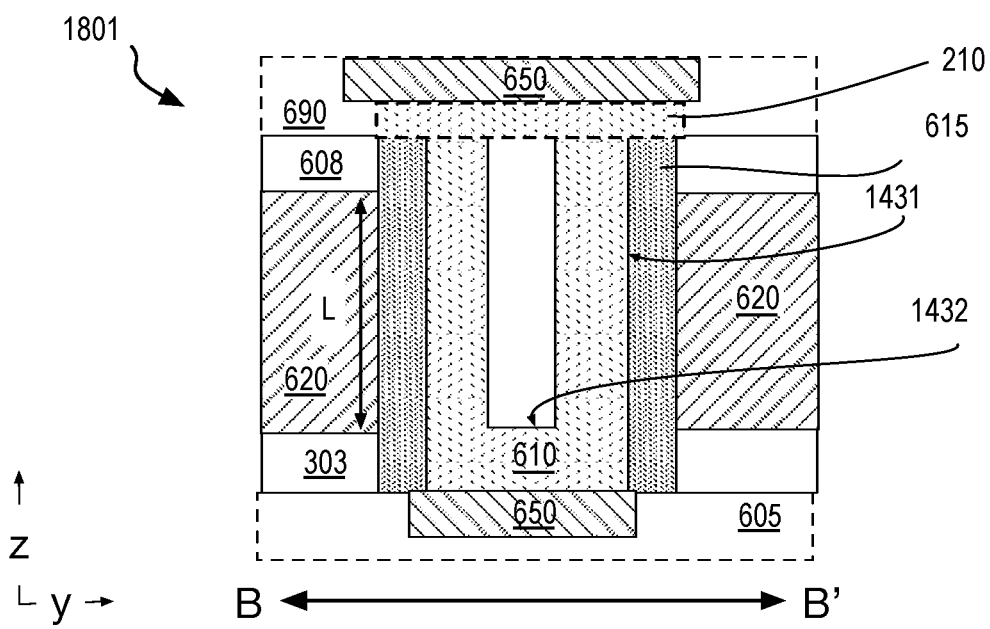
FIGS. 18A and 18B are cross sectional views of transistor structures including an in-situ doped metal oxide channel material, in accordance with some alternative embodiments.

FIG. 18A illustrates one exemplary transistor structure 1801, which may be fabricated according to methods 1701 (FIG. 17), for example. As shown in FIG. 18A, transistor structure 1801 includes top and bottom source and drain metallizations 650 in contact with channel material 610, which spans a vertical (e.g., z) distance between metallizations 650. As shown, vertical separation between source and drain metallizations 650 defines a channel length L of transistor structure 1801. Without the issues of pitch-off associated with PVD deposition techniques, channel material 610 deposited by the ALD techniques described herein allows the lateral dimensions (e.g., y-axis) between feature sidewalls 1431 to be scaled to smaller dimensions.

Although transistor structure 1801 includes only one gate electrode 620, a stack may include any number of layers of gate electrode material. A vertical string of gate controlled semiconductor channels may be employed in a variety of devices, such as an electronic memory device. For example, various vertical NAND-type architectures may be include an in-situ doped metal oxide channel material, such as any of those described above. A vertical NAND architecture is one example where a stack of gate electrode material layers may each be operable as a control gate electrode in a string comprising many transistor channels. Such structures may be fabricated according to methods 1701, for example. Layers of gate electrode material may each be coupled to wordlines of a NAND memory array. Metal oxide channel material, may be coupled to a bitline, and further coupled to a select transistor, for example.

Figure 18B:
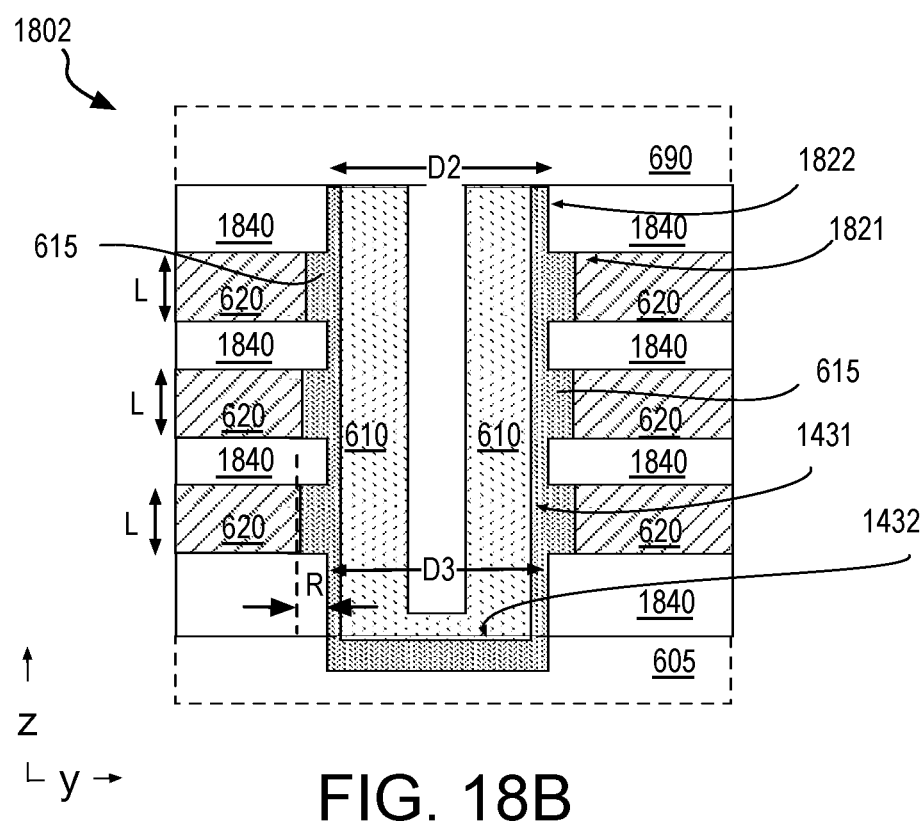

FIG. 18B is a cross sectional view of vertical TFT structure 1802, in accordance with some embodiments. In FIG. 18B, transistor structure 1802 is again over a substrate 605. Channel material 610 is adjacent to feature sidewall 1431, within a via of diameter D2 that may range from ten to a hundred nanometers, for example. A lower via diameter D3 may be somewhat smaller than via diameter D2, depending on a sidewall slope, or profile, for example. Dielectric material layers 1840 may each have any compositions and layer thicknesses. For example, dielectric material layers 1840 may be silicon dioxide, silicon nitride, silicon oxynitride, or any low-k material.

Channel material 610 may have any of the metal oxide compositions described above, for example, as formed according to methods 101. As further illustrated, transistor structure 1802 includes multiple layers of gate electrode material 620, each layer being separated by a layer of dielectric material 1840. Each layer of gate electrode material 620 has a sidewall 1821 that is recessed from dielectric material sidewall 1822 by a recess radial distance R. Radial distance R may vary from a few nanometers to tens of nanometers. In some examples, radial distance R is between 5 nm and 15 nm (e.g., 10 nm). Gate dielectric material 615 at least partially occupies the recess of radial distance R. While gate dielectric material 615 may be any suitable material, such as any of those examples described above, for an Fe-NAND embodiment, gate dielectric material 615 is a ferroelectric material. Some high-k dielectric materials are ferroelectrics when crystal texture is of a particular phase. In Fe (ferroelectric) TFT embodiments, gate dielectric material 615 has a permanent dipole. As a result, the threshold voltage ($V_t$) of each FeTFT can vary between multiple states (e.g., $V_{t,high}$ and $V_{t,low}$) as a function of the dipole state of the gate dielectric. A bit value may be assigned to a particular one of the threshold voltage levels, and read out accordingly.

In some embodiments, gate dielectric material 615 is a cylindrical structure between channel material 610 and a sidewall of gate electrode material layer 620. In the illustrated example, gate dielectric material 615 is in direct contact with gate electrode material sidewall 1821, and gate dielectric material 615 has a thickness substantially equal to radial distance R so that a semiconductor channel material 610 and gate electrode material 315 is substantially equal to via diameter D2 Channel material thickness T is less than twice the via diameter D2. Without the issues of pitch-off associated with PVD deposition techniques, channel material 610 deposited by the ALD techniques described herein enables via diameters D2/D3 to be scaled to smaller dimensions.

Although individual transistor structures are described in detail, any number of such structures may be fabricated concurrently and included within integrated circuitry. The various transistor structures and techniques described above are applicable to any IC architecture. In some particularly advantageous embodiments however, the transistor structures and techniques described above are employed within a 3D IC having more than one device level. In some embodiments, any the transistor structures and techniques described above are iterated to generate two, three, or more, levels of transistors, which may all be interconnected with inter-level metallization. In some other embodiments, any of the transistor structures and techniques described above are employed at least once to fabricate a back-end device level over a front-end device level. The front-end device level may comprise any suitable CMOS circuitry that may further include transistors utilizing a Group IV semiconductor channel material, such as silicon, germanium, or SiGe alloys. Such front-end transistors may have single crystalline channel regions that employ a portion of a single crystalline substrate, for example.

Figure 19:
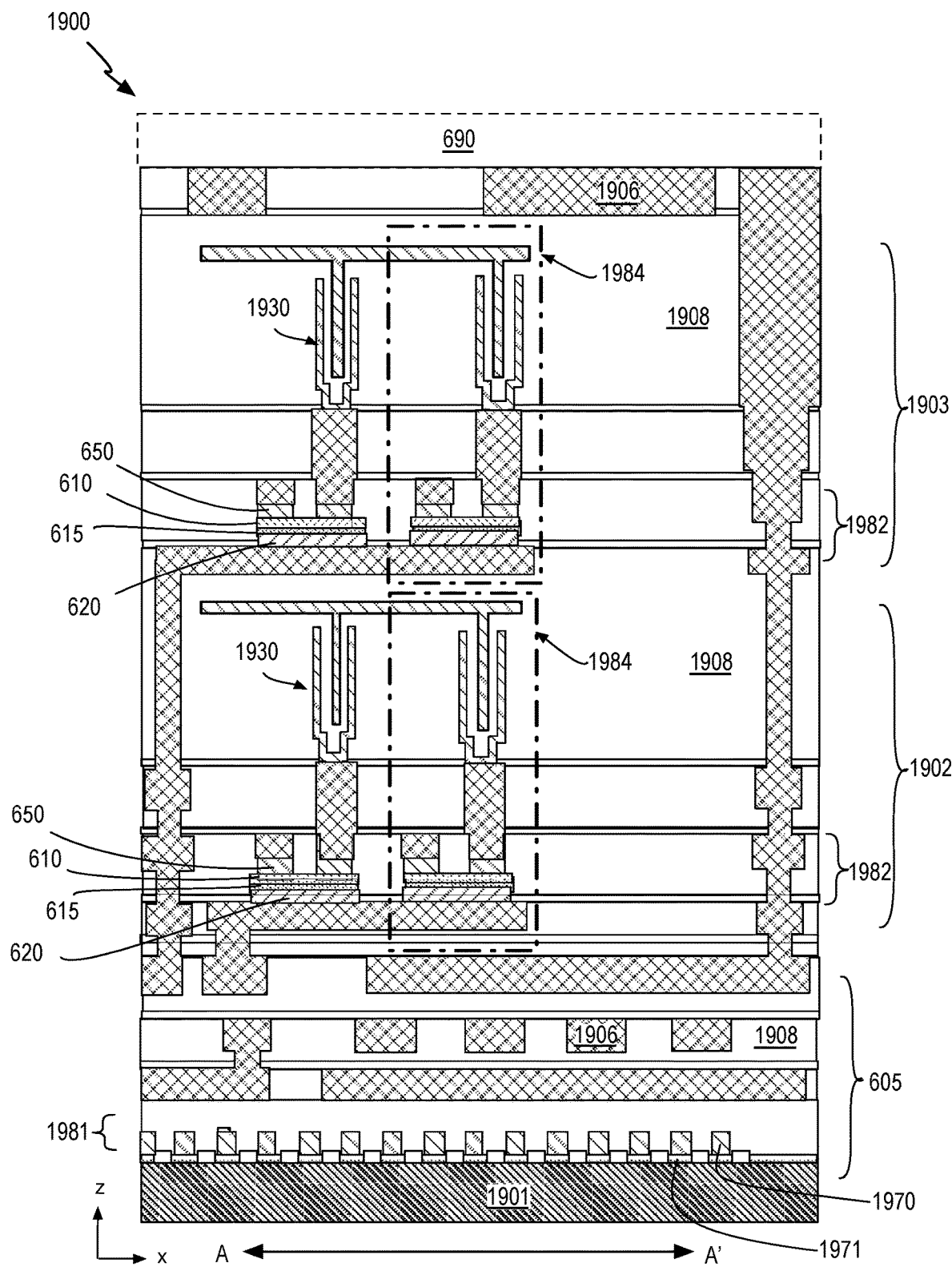
FIG. 19 is a cross-sectional view of a 3DIC structure including TFT circuitry over CMOS FET circuitry, in accordance with some embodiments.

FIG. 19 illustrates a cross-sectional side view of a 3D IC structure 1900, in accordance with some embodiments. Structure 1900 illustrates a portion of a monolithic IC that includes a substrate 605 that comprises FEOL device circuitry fabricated over and/or on a single crystalline substrate 1901. In this example, FEOL device circuitry includes a plurality of MOSFETs 1981 that employ a monocrystalline semiconductor material 1901 for at least a channel region of each transistor. FETs 1981 include a gate terminal 1970 separated from semiconductor material 1901 by a gate dielectric 1971. The channel region of semiconductor material 1901 separates semiconductor terminals (not depicted). Any materials known to be suitable for FETs may be present in FEOL FETs 1981. FETs 1981 may be planar or non-planar devices. In some advantageous embodiments, FETS 1981 are finFETs. FETs 1981 may include one or more semiconductor materials. As one example, semiconductor material 1901 is a surface layer of a substantially monocrystalline substrate.

FEOL device circuitry may further include one or more levels of interconnect metallization 1906 electrically insulated by dielectric material 1908. Interconnect metallization 1906 may be any metal(s) suitable for FEOL and/or BEOL IC interconnection (e.g., an alloy of predominantly Cu, an alloy of predominantly W, or an alloy of predominantly Ru, etc.). Dielectric material 1908 may be any dielectric material known to be suitable for electrical isolation of monolithic ICs. In some embodiments, dielectric material 1908 comprises silicon, and at least one of oxygen and nitrogen. Dielectric material 1908 may be SiO, SiN, or SiON, for example.

BEOL device circuitry 1902 is located over the FEOL device circuitry, with dielectric material 1908 therebetween. BEOL device circuitry 1902 includes a plurality of devices 1982 that employ metal oxide channel semiconductor material 610, which may be deposited and/or in-situ doped as described elsewhere herein. For the illustrated embodiments, individual ones of devices 1982 include gate electrode 620 separated from a channel region of metal oxide channel material 610 by gate dielectric 615. In the exemplary embodiment illustrated, device 1982 are "bottom-gate" TFTs with gate electrode 620 under channel material 610. Although bottom-gate devices are illustrated, embodiments herein are also applicable bottom-gate transistor architectures, side-gate transistor architectures, or other planar and non-planar transistor architectures, such as any of those described elsewhere herein.

BEOL circuitry may comprise any number of metallization levels over transistor structures 1982. Any number of interconnect metallization levels may be employed to couple BEOL circuitry to the underlying FEOL device circuitry. As further shown, a metal route (e.g., via) 606 electrically connects FEOL interconnect metallization to gate electrode 620.

In further embodiments, there may be multiple levels of BEOL device circuitry located over the FEOL device circuitry. Each level of BEOL device circuitry may include a plurality of TFTs 1982 that employ an in-situ doped metal oxide channel material. In the example illustrated in FIG. 19, TFTs 1982 are electrically coupled to a metal-insulator-metal (MIM) capacitor 1930. One TFT and one MIM capacitor 1930 are together functional as 1T1C memory cells 1984, denoted by dot-dashed line. Within one memory cell 1984, one TFT 1982 is operable as a cell select transistor. A 3DIC may include any number of device layers, with the example illustrated in FIG. 19 including two metal cell levels of 1902, 1903 vertically stacked over FEOL circuitry.

Figure 20:
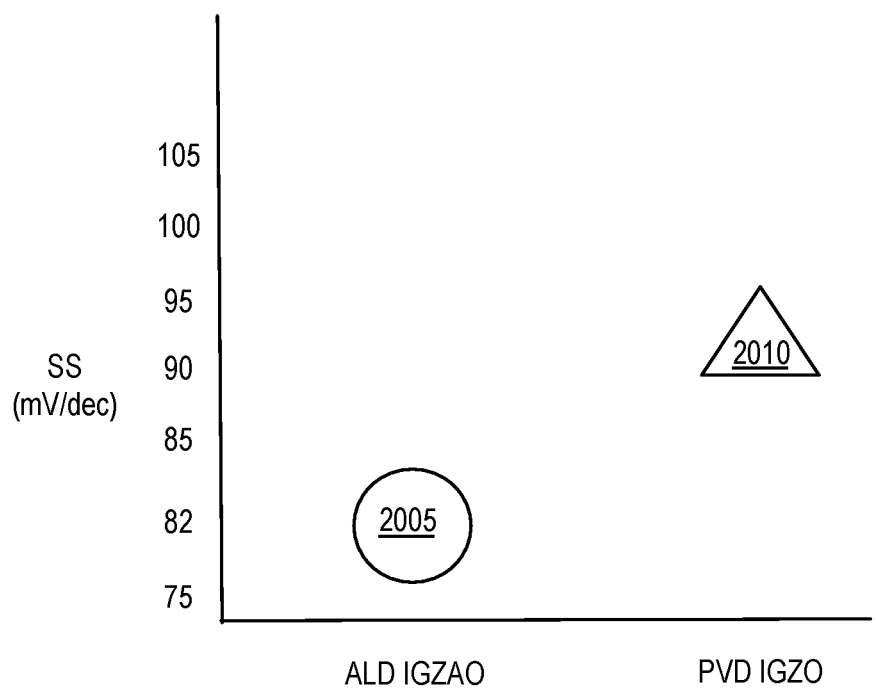
FIG. 20 is graph illustrating improved sub-threshold slope in a transistor including an in-situ doped metal oxide channel material, in accordance with some embodiments.

As noted above, the inventors have found transistors including a quinary metal oxide channel material to have much improved electrical performance relative to reference structures incorporating ex-situ doped metal oxide channel material. FIG. 20 is graph illustrating improved sub-threshold slope of a transistor including an in-situ doped metal oxide channel material, in accordance with some embodiments. As shown, TFTs 2005 with channel material of IGZAO deposited with an ALD process with in-situ Al doping, have a much lower sub-threshold slope (e.g., around 80 mV/dec) than do reference TFTs 2010 with channel material of IGZO deposited with PVD and ex-situ doping. Lower sub-threshold slope is indicative of fewer defect states and better channel quality. For IGZAO treatment group, the channel material was Ga-rich IGZO having a atomic concentration ratios within the ranges described above as exemplary. The in-situ Al doping is likewise to a concentration within the range described above as exemplary. FIG. 20 therefore illustrates a measurable performance gain attributable to the in-situ doping and low defect densities achieved with the ALD-based deposition techniques described herein.

Figure 21:
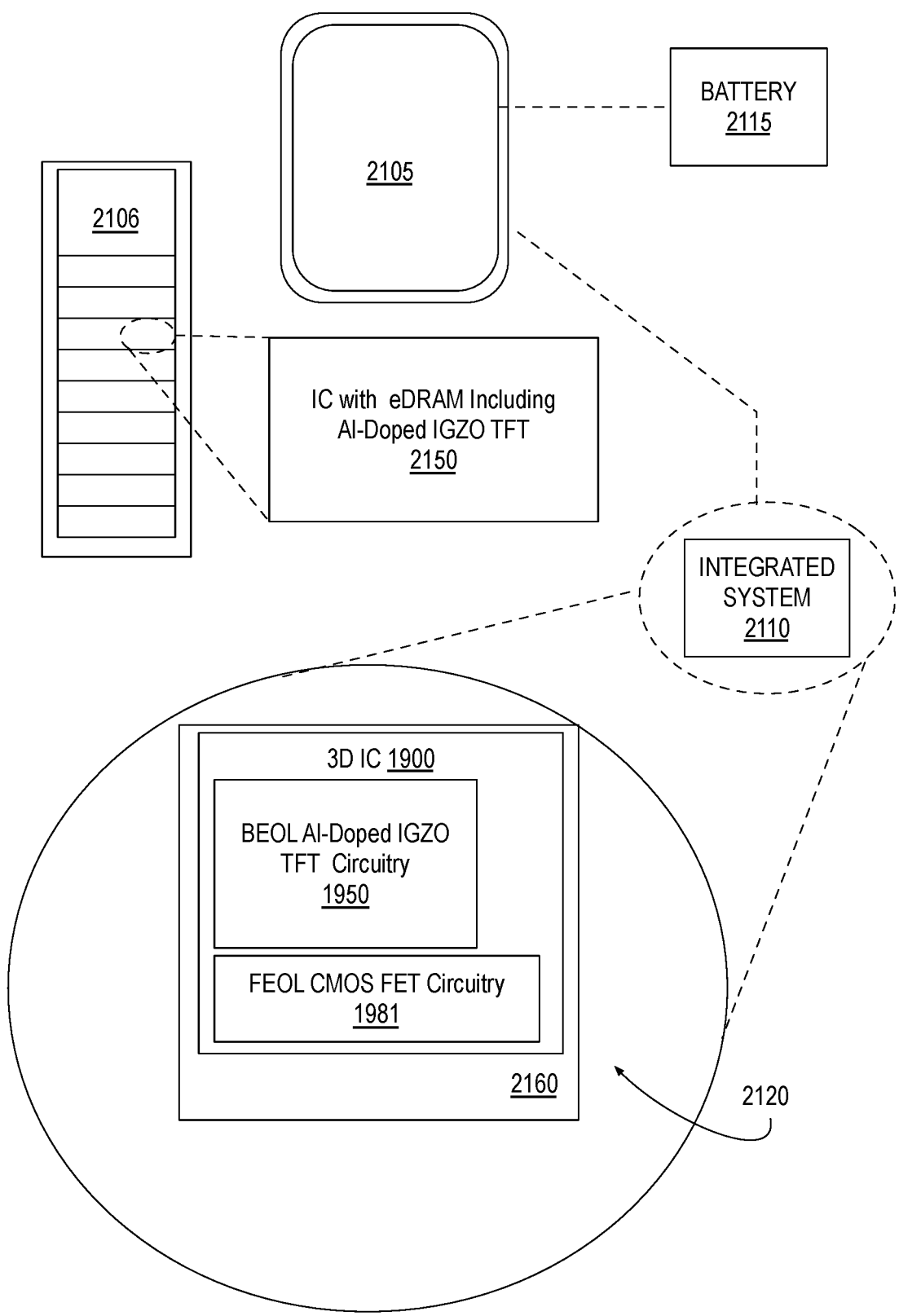
FIG. 21 illustrates a system employing an IC including TFT circuitry over CMOS FET circuitry, in accordance with some embodiments.

FIG. 21 illustrates a system in which a mobile computing platform 2105 and/or a data server machine 2106 employs an IC including at least one semiconductor device. The server machine 2106 may be any commercial server, for example including any number of high-performance computing platforms disposed within a rack and networked together for electronic data processing, which in the exemplary embodiment includes a packaged monolithic IC 2150. The mobile computing platform 2105 may be any portable device configured for each of electronic data display, electronic data processing, wireless electronic data transmission, or the like. For example, the mobile computing platform 2105 may be any of a tablet, a smart phone, laptop computer, etc., and may include a display screen (e.g., a capacitive, inductive, resistive, or optical touchscreen), a chip-level or package-level integrated system 2110, and a battery 2115.

Whether disposed within the integrated system 2110 illustrated in the expanded view 2120, or as a stand-alone packaged chip within the server machine 2106, a monolithic 3D IC 1900 includes a memory chip (e.g., RAM), or a processor chip (e.g., a microprocessor, a multi-core microprocessor, graphics processor, or the like) including at least one TFT including an in-situ doped metal oxide channel material, for example as described elsewhere herein. 3D IC 1900 may further include silicon CMOS front-end circuitry including FETs 1981. The 3D IC 1900 may be further coupled to a board, a substrate, or an interposer 2160.

3D IC 1900 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 22:
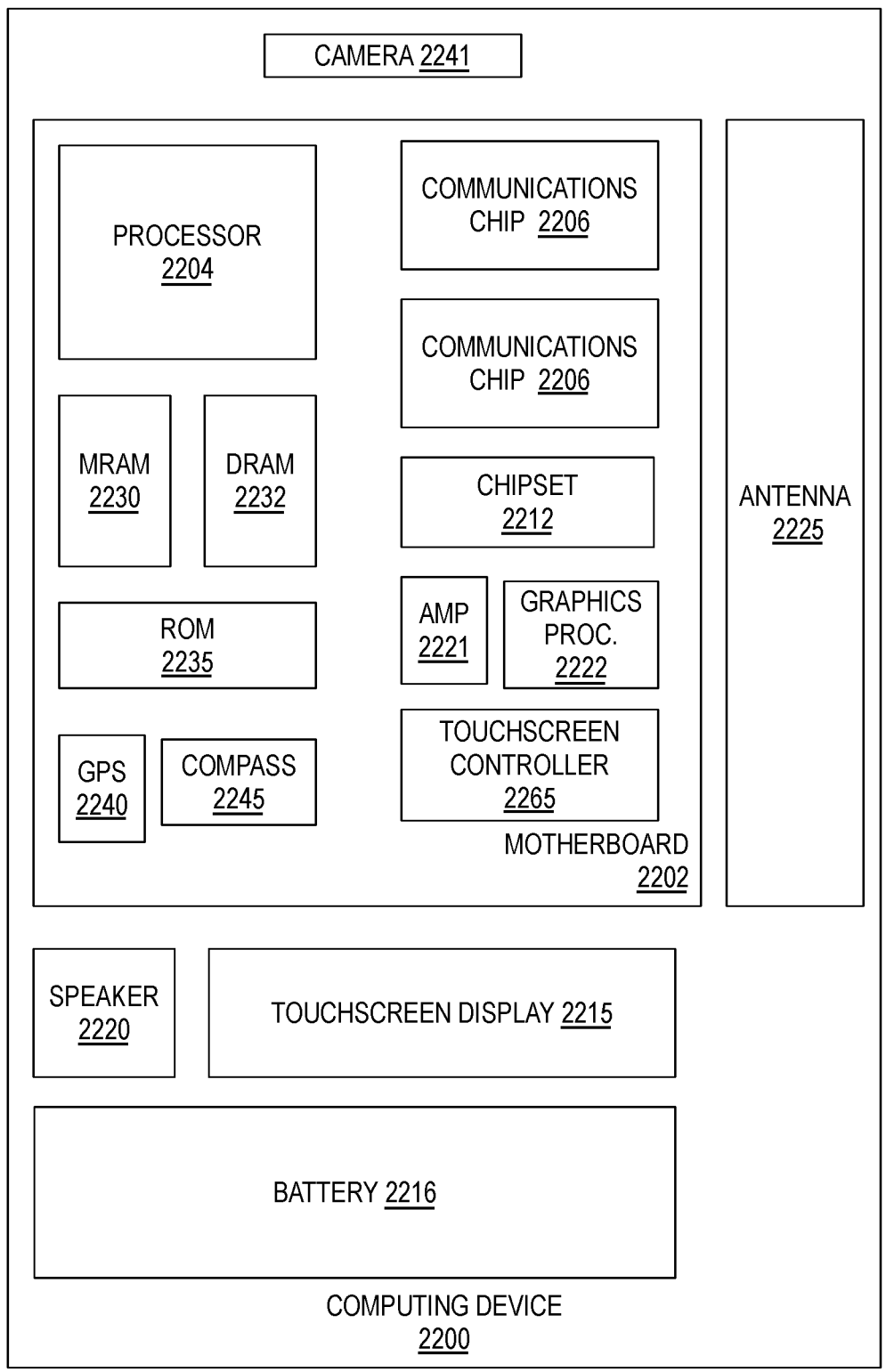
FIG. 22 is a functional block diagram illustrating an electronic computing device, in accordance with some embodiments.

FIG. 22 is a functional block diagram of an electronic computing device 2200, in accordance with some embodiments. Device 2200 further includes a motherboard 2202 hosting a number of components, such as, but not limited to, a processor 2204 (e.g., an applications processor). Processor 2204 may be physically and/or electrically coupled to motherboard 2202. In some examples, processor 2204 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 2206 may also be physically and/or electrically coupled to the motherboard 2202. In further implementations, communication chips 2206 may be part of processor 2204. Depending on its applications, computing device 2200 may include other components that may or may not be physically and electrically coupled to motherboard 2202. These other components include, but are not limited to, volatile memory (e.g., DRAM 2232), non-volatile memory (e.g., ROM 2235), flash memory (e.g., NAND or NOR), magnetic memory (MRAM 2230), a graphics processor 2222, a digital signal processor, a crypto processor, a chipset 2212, an antenna 2225, touchscreen display 2215, touchscreen controller 2265, battery 2216, audio codec, video codec, power amplifier 2221, global positioning system (GPS) device 2240, compass 2245, accelerometer, gyroscope, speaker 2220, camera 2241, and mass storage device (such as hard disk drive, solid-state drive (SSD), compact disk (CD), digital versatile disk (DVD), and so forth), or the like.

Communication chips 2106 may enable wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2206 may implement any of a number of wireless standards or protocols, including but not limited to those described elsewhere herein. As discussed, computing device 2200 may include a plurality of communication chips 2206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor structure, comprises a channel material comprising O, In, Ga, Zn, and Al with an atomic composition ratio of Ga to each of In and Zn of 1.5-2.5, and an atomic composition ratio of Ga to Al of 8-50. The structure comprises a source contact and a drain contact electrically coupled to the channel material. The structure comprises a gate stack comprising a gate electrode material and a gate dielectric material coupled with a portion of the channel material between the source contact and drain contact.

In second examples, for any of the first examples Al is no more than 5 at. % of the metals present in the channel material.

In third examples, for any of the first through second examples Al is at least 1 at. % of the metals present in the channel material.

In fourth examples, for any of the first through third examples each of In and Zn is least 20 at. % of the metals present in the channel material.

In fifth examples, for any of the first through fourth examples Ga is 40-50 at. % of the metals present in the channel material, and each of In and Zn is less than 25 at. % of the metals present in the channel material.

In sixth examples, for any of the first through fifth examples the gate dielectric material comprises O and at least one of Hf or Al.

In seventh examples, for any of the first examples a first portion of the channel material is adjacent to a sidewall of a topographic feature, and a second portion of the channel material is over a top surface of a topographic feature. The first portion of the channel material has a first thickness in a direction normal to the sidewall, and the second portion of the channel material has a second thickness in a direction normal to the top surface. The first thickness is within 5% of the second thickness.

In sixth examples, an integrated circuit (IC) die, comprises a plurality of complementary metal-oxide-semiconductor (CMOS) field effect transistor (FET) structures. Individual ones of the CMOS FET structures comprise a Group IV semiconductor material. The IC die further comprises a plurality of thin film transistor (TFT) structures over the CMOS FET structures, with one or more levels of interconnect metallization therebetween, wherein individual ones of the TFT structures comprise the transistor structure of the first examples.

In ninth examples, a method of fabricating a transistor structure comprises forming a channel semiconductor material over a substrate by cyclically depositing a precursor of each of a plurality of metals during a deposition phase of a cycle, and oxidizing the deposited precursor of each of a plurality of metals during an oxidation phase of the cycle. The method comprises forming a gate, source, and drain coupled to the channel semiconductor material.

In tenth examples, for any of the ninth examples, cyclically depositing the precursor of each of the plurality of metals, and oxidizing the deposited precursor of each of the plurality of metals further comprises performing a first cycle one or more times. Each of the first cycles further comprises adsorbing a first precursor to a material surface, wherein the first precursor comprises a first metal, and forming a metal oxide comprising the first metal by oxidizing the first precursor. For any of the ninth examples the method comprises performing a second cycle one or more times. Each of the second cycles further comprises adsorbing a second metal precursor to a surface of the metal oxide, forming a metal oxide comprising the second metal by oxidizing the second precursor, and performing a third cycle one or more times. Each of the third cycles further comprises adsorbing a third metal precursor to a surface of the metal oxide, and forming a metal oxide comprising the third metal by oxidizing the third precursor.

In eleventh examples, for any of the ninth through tenth examples the method further comprises doping the metal oxide with a fourth metal after performing one or more of the first, second or third cycles.

In twelfth examples, for any of the eleventh examples doping the metal oxide with the fourth metal further comprises adsorbing a fourth metal precursor to a material, and forming a metal oxide comprising the fourth metal by oxidizing the fourth precursor.

In thirteenth examples, for any of the twelfth examples at least one of the first, second or third cycles further comprises adsorbing the fourth precursor after adsorbing one of the first, second, or third precursors, and oxidizing the fourth precursor is simultaneous with oxidizing of the first of the first, second, or third precursors.

In fourteenth examples, for any of the thirteenth examples least one of the first, second or third cycles further comprises adsorbing and oxidizing the fourth precursor after adsorbing and oxidizing one of the first, second, or third precursors.

In fifteenth examples, for any of the fourteenth examples the method further comprises performing a fourth cycle one or more times, each of the fourth cycles further comprising adsorbing a fourth precursor to a material surface, and oxidizing the fourth precursor. The fourth cycle is performed at some first frequency that is lower than a second frequency at which one or more of the first, second and third cycles are performed.

In sixteenth examples, for any of the fifteenth examples the second frequency is greater than the first frequency by at least a factor of 8.

In seventeenth examples, for any of the tenth through sixteenth examples two of the first, second and third cycles are performed at a third frequency, and the second frequency is greater than the third frequency by at least at factor of 1.5.

In eighteenth examples, for any of the tenth through sixteenth examples the second and third metals are each one of In, Ga and Zn, and one of the first, second, and third cycles associated with Ga is performed at a higher frequency than the other of the first, second, and third cycles associated with In and Zn.

In nineteenth examples, for any of the tenth through eighteenth examples one of the first, second, or third precursors comprises trimethylindium (TMI), triethylindium (TEI), or cyclopentadienyl indium (CpIn).

In twentieth examples, for any of the nineteenth examples one of the first, second, or third precursors comprises timethylgallium (TMG), triethylgallium (TEG), or tris-dimethylamidogallium (TDMAGA).

In twenty-first examples, for any of the twentieth examples one of the first, second, or third precursors comprises diethylzinc (DEZ) or dimethylzinc (DMZ).

In twenty second examples, for any of the twelfth examples the fourth precursor comprises trimethylaluminum (TMA), triethylaluminum (TEA), or aluminum trichloride.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
   a first source or drain contact;
   a gate electrode material layer over the first source or drain contact;
   a gate insulator lining a via through a thickness of the gate electrode material layer and in contact with a sidewall of the gate electrode material layer;
   a channel material comprising a first portion lining a sidewall of the gate insulator within the via and a second portion over, and in contact with, the first source or drain contact at a bottom of the via, the first and second portions of the channel material comprising O, In, Ga, Zn, and Al with an atomic composition ratio of Ga to each of In and Zn of 1.5-2.5, and an atomic composition ratio of Ga to Al of 8-50, the first portion of the channel material of a first layer thickness, and the second portion of the channel material of a second layer thickness, wherein the first layer thickness is within 5% of the second layer thickness; and a second source contact or drain contact electrically coupled to the channel material.

2. The transistor structure of claim 1, wherein the Ga:In:Zn atomic ratio is 1.5-2.5:0.75-1.25:0.75-1.25, and wherein Al is no more than 5 at. % of all metals present in the channel material.

3. The transistor structure of claim 1, wherein Al is at least 1 at. % of all metals present in the channel material.

4. The transistor structure of claim 1, wherein each of In and Zn is least 20 at. % of all metals present in the channel material.

5. The transistor structure of claim 1, wherein Ga is 40-50 at. % of all metals present in the channel material and each of In and Zn is less than 25 at. % of all metals present in the channel material.

6. The transistor structure of claim 1, wherein the gate insulator comprises O and at least one of Hf or Al.

7. An integrated circuit (IC) die, comprising:
a plurality of complementary metal-oxide-semiconductor (CMOS) field effect transistor (FET) structures, wherein individual ones of the CMOS FET structures comprise a Group IV semiconductor material; and
a plurality of thin film transistor (TFT) structures over the CMOS FET structures, with one or more levels of interconnect metallization therebetween, wherein individual ones of the TFT structures comprise the transistor structure of claim 1.

8. A transistor structure, comprising:
a first source or drain contact;
a gate electrode material layer adjacent to, and at a level above, the first source or drain contact,
a gate insulator comprising a first portion lining a sidewall of the gate electrode material layer and a second portion over the first source or drain contact;
a channel material comprising a first portion lining a sidewall of the first portion of the gate insulator and a second portion over the second portion of the gate insulator, the first and second portions of the channel material comprising O, In, Ga, Zn, and Al with an atomic composition ratio of Ga to each of In and Zn of 1.5-2.5, and an atomic composition ratio of Ga to Al of 8-50, the first portion of the channel material of a first layer thickness, and the second portion of the channel material of a second layer thickness, wherein the first layer thickness is within 5% of the second layer thickness; and
a second source contact or drain contact electrically coupled to the channel material.

9. The transistor structure of claim 8, wherein the Ga:In:Zn atomic ratio is 1.5-2.5:0.75-1.25:0.75-1.25, and wherein Al is no more than 5 at. % of all metals present in the channel material.

10. The transistor structure of claim 8, wherein Al is at least 1 at. % of all metals present in the channel material.

11. The transistor structure of claim 8, wherein each of In and Zn is least 20 at. % of all metals present in the channel material.

12. The transistor structure of claim 8, wherein Ga is 40-50 at. % of all metals present in the channel material and each of In and Zn is less than 25 at. % of all metals present in the channel material.

13. The transistor structure of claim 8, wherein the gate insulator comprises O and at least one of Hf or Al.

* * * * *